(12) United States Patent
Sawachi

(10) Patent No.: US 11,694,878 B2
(45) Date of Patent: *Jul. 4, 2023

(54) GAS SUPPLY SYSTEM, PLASMA PROCESSING APPARATUS, AND CONTROL METHOD FOR GAS SUPPLY SYSTEM

(71) Applicant: TOKYO ELECTRON LIMITED, Tokyo (JP)

(72) Inventor: Atsushi Sawachi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1 day.

This patent is subject to a terminal disclaimer.

(21) Appl. No.: 17/560,242

(22) Filed: Dec. 22, 2021

(65) Prior Publication Data

US 2022/0115213 A1   Apr. 14, 2022

Related U.S. Application Data

(63) Continuation of application No. 16/979,793, filed as application No. PCT/JP2019/023994 on Jun. 18, 2019, now Pat. No. 11,217,432.

(30) Foreign Application Priority Data

Jul. 2, 2018   (JP) ................................ 2018-126127

(51) Int. Cl.
    *H01J 37/32*      (2006.01)
    *C23C 16/455*     (2006.01)
    *H01L 21/67*      (2006.01)

(52) U.S. Cl.
    CPC .. *H01J 37/32449* (2013.01); *C23C 16/45544* (2013.01); *H01J 37/32834* (2013.01); *H01L 21/67069* (2013.01); *H01J 2237/334* (2013.01)

(58) Field of Classification Search
    CPC ........... H01J 37/32449; H01J 37/32834; H01J 2237/334; C23C 16/45544;
    (Continued)

(56) References Cited

U.S. PATENT DOCUMENTS 6,787,481 B2 *   9/2004  Asai ...................... C23C 16/405
                                                    438/785
7,020,981 B2 *   4/2006  Shero .................. C23C 16/4412
                                                    118/715
(Continued)

FOREIGN PATENT DOCUMENTS

JP   2008-91651 A    4/2008
JP   2012-114275 A   6/2012
(Continued)

OTHER PUBLICATIONS

International Search Report for PCT/JP2019/023994 (English translation) dated Jul. 30, 2019, 2 pages.

*Primary Examiner* — Rudy Zervigon
(74) *Attorney, Agent, or Firm* — Weihrouch IP

(57) ABSTRACT

When a gas supplied to a gas injection unit is switched from a first processing gas to a second processing gas, a controller of a gas supply system performs control to open a first supply on/off valve connected to the gas injection unit and provided in a first gas supply line for supplying the first processing gas and a second exhaust on/off valve provided in a first gas exhaust line branched from the first gas supply line, close a second supply on/off valve connected to the gas injection unit and provided in a second gas supply line for supplying the second processing gas and a first exhaust on/off valve provided in a second gas exhaust line branched from the second gas supply line; and then open the second supply on/off valve and the first exhaust on/off valve and close the first supply on/off valve and the second exhaust on/off valve.

13 Claims, 18 Drawing Sheets

(58) Field of Classification Search
CPC ........ C23C 16/45574; C23C 16/45561; H01L 21/67069; H01L 21/205; H01L 21/3065; H01L 21/31
USPC .............. 118/695, 696; 156/345.24, 345.26; 427/248.1
See application file for complete search history.

(56) References Cited

U.S. PATENT DOCUMENTS

| | | | | |
|---|---|---|---|---|
| 7,666,479 | B2* | 2/2010 | Strang | C23C 16/45523 427/569 |
| 7,708,859 | B2* | 5/2010 | Huang | H01J 37/32449 156/345.34 |
| 7,740,704 | B2* | 6/2010 | Strang | C23C 16/45574 118/715 |
| 8,088,248 | B2* | 1/2012 | Larson | H01L 21/31144 156/345.33 |
| 8,231,799 | B2* | 7/2012 | Bera | H01J 37/32449 216/67 |
| 8,235,001 | B2* | 8/2012 | Sano | C23C 16/4408 118/696 |
| 8,398,770 | B2* | 3/2013 | Levy | C23C 16/45519 118/718 |
| 8,869,742 | B2* | 10/2014 | Dhindsa | C23C 16/45576 118/723 E |
| 9,175,393 | B1* | 11/2015 | Higashi | C23C 16/54 |
| 10,066,297 | B2* | 9/2018 | Higashi | C23C 16/45572 |
| 10,431,431 | B2* | 10/2019 | Taskar | C23C 14/22 |
| 10,472,717 | B2* | 11/2019 | Sawachi | C23C 16/455 |
| 10,954,597 | B2* | 3/2021 | de Ridder | C23C 16/45548 |
| 10,978,315 | B2* | 4/2021 | Shiokawa | H01L 21/31 |
| 2001/0040100 | A1* | 11/2001 | Wang | C25D 5/026 205/220 |
| 2002/0192369 | A1* | 12/2002 | Morimoto | C23C 16/52 427/248.1 |
| 2003/0000924 | A1* | 1/2003 | Strang | H01J 37/3244 216/86 |
| 2005/0241763 | A1* | 11/2005 | Huang | C23C 16/45565 156/345.33 |
| 2010/0167426 | A1 | 7/2010 | Kofuji et al. | |
| 2011/0212625 | A1* | 9/2011 | Toyoda | H01J 37/32082 438/758 |
| 2012/0031500 | A1* | 2/2012 | Hirose | C23C 16/45561 137/14 |
| 2012/0132367 | A1* | 5/2012 | Tezuka | H01J 37/3244 156/345.33 |
| 2014/0335287 | A1* | 11/2014 | Nagai | C23C 16/45536 427/569 |
| 2015/0000707 | A1* | 1/2015 | Takahashi | H01J 37/32449 134/22.18 |
| 2015/0228457 | A1* | 8/2015 | Yamashita | H01J 37/32449 216/67 |
| 2015/0368798 | A1* | 12/2015 | Kwong | C23C 16/45578 118/729 |
| 2016/0372348 | A1* | 12/2016 | Sawachi | H01J 37/32449 |
| 2017/0159180 | A1* | 6/2017 | Sawachi | H01L 21/02274 |
| 2018/0180509 | A1* | 6/2018 | Sawachi | C23C 16/45561 |
| 2019/0138033 | A1* | 5/2019 | Sawachi | H01J 37/3244 |
| 2021/0043425 | A1* | 2/2021 | Sawachi | H01L 21/67069 |

FOREIGN PATENT DOCUMENTS

| | | |
|---|---|---|
| JP | 2012-129356 A | 7/2012 |
| JP | 2018-160550 A | 10/2018 |
| TW | 201241866 A | 10/2012 |

\* cited by examiner

GAS SUPPLY SYSTEM, PLASMA PROCESSING APPARATUS, AND CONTROL METHOD FOR GAS SUPPLY SYSTEM

CROSS-REFERENCE TO RELATED APPLICATION(S)

This application is a continuation application of U.S. application Ser. No. 16/979,793 filed on Sep. 10, 2020, which is a continuation of 35 USC § 371 National Phase Application No. PCT/JP2019/023994 filed Jun. 18, 2019, which claims priority from Japanese Patent Application No. 2018-126127 filed on Jul. 2, 2018, all of which are incorporated herein in their entirety by reference is claimed to each.

TECHNICAL FIELD

The present disclosure relates to a gas supply system, a plasma processing apparatus, and a control method for the gas supply system.

BACKGROUND

For example, in Patent Document 1, a gas diffusion chamber in a shower head is divided into a plurality of spaces by partition walls. Further, gas distribution pipes communicating with the respective spaces and valves that are open and closed to allow adjacent gas distribution pipes to communicate with each other are provided. Patent Document 1 discloses a technique that a processing gas supplied to each of the spaces is switched by opening and closing the valves.

PRIOR ART

Patent Document 1: Japanese Patent Application Publication No. 2012-114275

The present disclosure provides a technique capable of stably and rapidly switching a processing gas.

SUMMARY

In accordance with an aspect of the present disclosure, there is provided a gas supply system including: a gas injection unit that is disposed to face a substrate support on which a target object is to be placed and configured to inject a gas from a plurality of gas injection holes formed on a facing surface of the gas injection unit that faces the substrate support; a first gas supply line that is connected to the gas injection unit and configured to supply a first processing gas; a second gas supply line that is connected to the gas injection unit and configured to supply a second processing gas; a first gas exhaust line that is branched from the first gas supply line and configured to exhaust the first processing gas flowing through the first gas supply line to a gas exhaust mechanism; a second gas exhaust line that is branched from the second gas supply line and configured to exhaust the second processing gas flowing through the second gas supply line to the gas exhaust mechanism; a first supply on/off valve that is disposed at a downstream side of a branch point of the first gas supply line where the first gas exhaust line is branched and configured to switch an ON/OFF state of the first gas supply line; a second supply on/off valve that is disposed at a downstream side of a branch point of the second gas supply line where the second gas exhaust line is branched and configured to switch an ON/OFF state of the second gas supply line; a first exhaust on/off valve configured to switch an ON/OFF state of the first gas exhaust line; a second exhaust on/off valve configured to switch an ON/OFF state of the second gas exhaust line; and a controller configured to control the first supply on/off valve and the second exhaust on/off valve to be in an open state and the second supply on/off valve and the first exhaust on/off valve to be in a closed state, and then control the second supply on/off valve and the first exhaust on/off valve to be in an open state and the first supply on/off valve and the second exhaust on/off valve to be in a closed state when the gas supplied to the gas injection unit is switched from the first processing gas to the second processing gas, and control the second supply on/off valve and the first exhaust on/off valve to be in the open state and the first supply on/off valve and the second exhaust on/off valve to be in the closed state, and then control the first supply on/off valve and the second exhaust on/off valve to be in the open state and the second supply on/off valve and the first exhaust on/off valve to be in the closed state when the gas supplied to the gas injection unit is switched from the second processing gas to the first processing gas.

In accordance with the aspect of the present disclosure, it is possible to switch the processing gas stably and rapidly.

DETAILED DESCRIPTION

Hereinafter, a gas supply system, a plasma processing apparatus, and a control method for the gas supply system according to embodiments of the present disclosure will be described in detail with reference to the accompanying drawings. However, the following embodiments are not intended to limit the gas supply system, the plasma processing apparatus, and the control method for the gas supply system of the present disclosure.

In a plasma processing apparatus for performing a plasma treatment, a plurality of processing gases may be used and switched to perform the plasma treatment. For example, an atomic layer etching (ALE) that etches an etching target film layer by layer has been suggested as a type of etching method. In the atomic layer etching, the etching target film is etched using plasma by repeating a step of adsorbing an adsorbate generated based on a first processing gas on the etching target film and a step of activating the adsorbate using a second processing gas.

In such a plasma processing apparatus that performs the plasma treatment by switching the plurality of processing gases, it is desired that the processing gases are stably and rapidly switched.

<Configuration of the Plasma Processing Apparatus>

Figure 1:
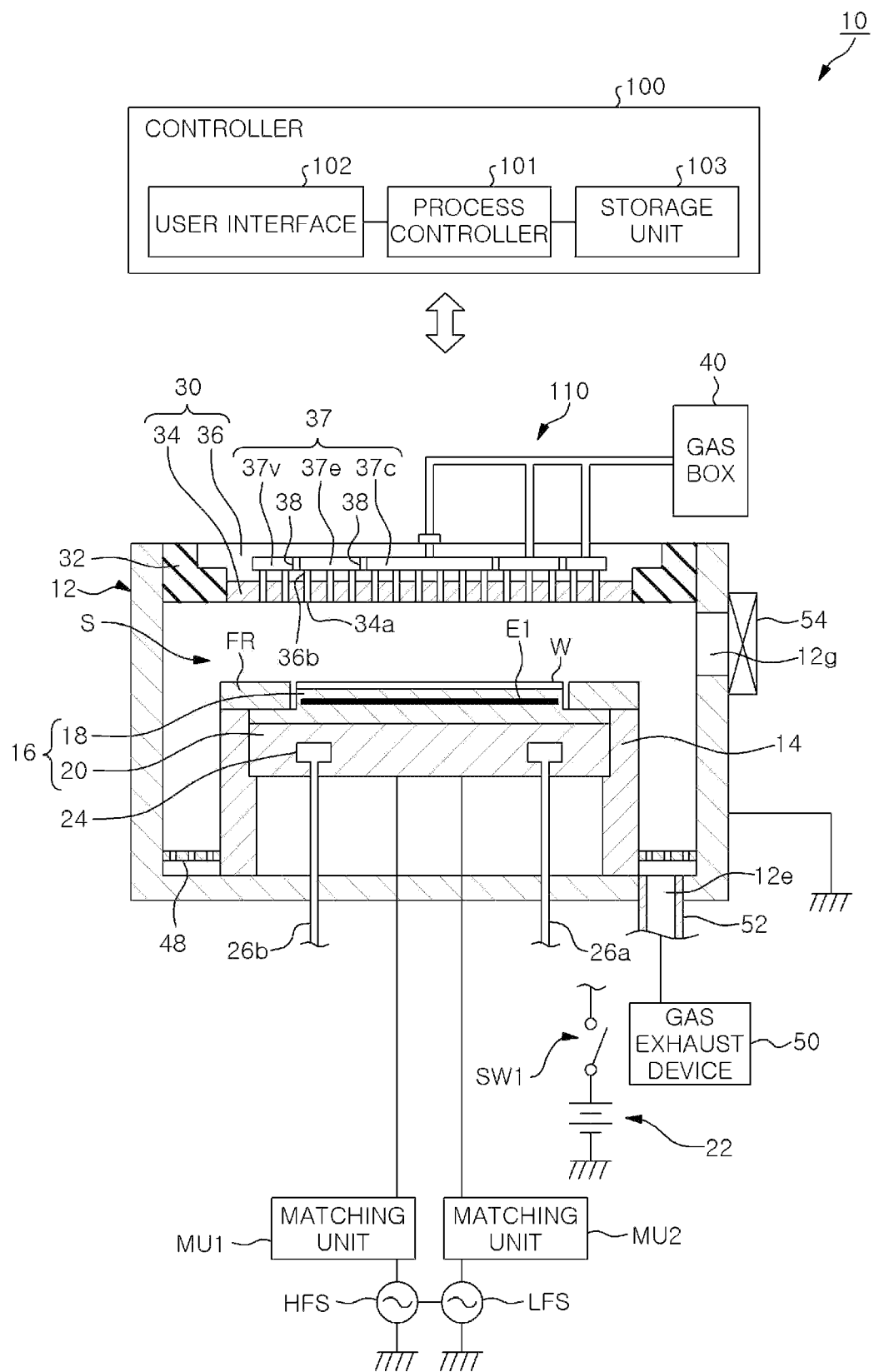
FIG. 1 is a cross sectional view showing an example of a schematic configuration of a plasma processing apparatus according to an embodiment.

A plasma processing apparatus 10 according to an embodiment will be described. FIG. 1 is a cross sectional view showing a schematic configuration of a plasma processing apparatus according to an embodiment. The plasma processing apparatus 10 shown in FIG. 1 is a capacitively-coupled parallel-plate plasma etching apparatus. The plasma processing apparatus 10 includes a substantially cylindrical processing chamber 12.

A substrate support 16 is disposed in the processing chamber 12. The substrate support 16 includes a support member 18 and a base 20. A top surface of the support member 18 is a substrate supporting surface on which a target object to be subjected to a plasma treatment is placed. In the present embodiment, a wafer W that is the target object for the plasma etching is placed on the top surface of the support member 18. The base 20 has a substantially disc shape and a main part thereof is made of a conductive metal such as aluminum. The base 20 serves as a lower electrode. The base is supported by a support portion 14. The support portion 14 is a cylindrical member vertically extending upward from the bottom of the processing chamber 12.

A first radio frequency power supply HFS is electrically connected to the base 20 through a matching unit MU1. The first radio frequency power supply HFS is a power supply configured to generate a radio frequency power for plasma generation having a frequency in a range from 27 to 100 MHz, e.g., 40 MHz. The matching unit MU1 includes a circuit for matching an output impedance of the first radio frequency power supply HFS with an input impedance of a load side (base 20 side).

A second radio frequency power supply LFS is electrically connected to the base 20 through a matching unit MU2. The second radio frequency power supply LFS is configured to generate a radio frequency power (radio frequency bias power) for attracting ions into the wafer W and apply the radio frequency bias power to the base 20. A frequency of the radio frequency bias power is within a range from 400 kHz to 13.56 MHz, e.g., 3 MHz. The matching unit MU2 includes a circuit for matching an output impedance of the second radio frequency power supply LFS with an input impedance of the load side (base 20 side).

The support member 18 is disposed on the base 20. The support member 18 is, for example, an electrostatic chuck. The wafer W is attracted to and held on the support member 18 by an electrostatic force such as a Coulomb force. The support member 18 includes an electrode E1 for electrostatic adsorption in a main body portion formed of ceramic. A DC power supply 22 is electrically connected to the electrode E1 through a switch SW1. The support member 18 may further include a heater for temperature control of the wafer W.

A focus ring FR is disposed on a top surface of the base 20 to surround the support member 18. The focus ring FR is provided to improve uniformity of a plasma treatment. The focus ring FR is formed of a material appropriately selected depending on the plasma treatment to be performed. For example, the focus ring FR may be formed of silicon or quartz.

A coolant channel 24 is formed in the base 20. The coolant is supplied to the coolant channel 24 from a chiller unit provided outside of the processing chamber 12 through a line 26a. The coolant supplied to the coolant channel 24 returns to the chiller unit through a line 26b.

An upper electrode 30 serving as a shower head for supplying a gas toward the wafer W is disposed in the processing chamber 12. In the plasma processing apparatus 10 according to the embodiment, the upper electrode 30 corresponds to the gas injection unit. The upper electrode is disposed above the substrate support 16 to be opposite to the base 20. The base 20 and the upper electrode 30 are arranged to be substantially parallel to each other. A processing space S where plasma for performing a plasma treatment on the wafer W is formed between the upper electrode and the lower electrode 20.

The upper electrode 30 is supported at an upper portion of the processing chamber 12 via an insulating shield member 32. The upper electrode 30 may include an electrode plate 34 and an electrode holder 36. The electrode plate 34 faces the processing space S, and a plurality of gas injection holes 34a are formed in the electrode plate 34.

The electrode holder 36 is made of a conductive material such as aluminum and is configured to detachably hold the electrode plate 34. The electrode holder 36 may have a water-cooling structure. A gas diffusion chamber 37 having a disc-shaped space is formed in the electrode holder 36. The gas diffusion chamber 37 is divided into a plurality of spaces. For example, the gas diffusion chamber 37 is provided with annular partition wall members 38. In the plasma processing apparatus 10 according to the present embodiment, the gas diffusion chamber 37 is divided into a plurality of spaces in the radial direction by the partition wall members 38. For example, the gas diffusion chamber 37 is divided into three zones of a gas diffusion zone 37c, a gas diffusion zone 37e, and a gas diffusion zone 37v to respectively correspond to a center portion that is a central portion of the wafer W, an edge portion that is a peripheral portion of the wafer W, and a very edge portion that is an outermost edge portion of the wafer W. However, the number of zones defining the gas diffusion chamber 37 is not limited to three and may be two or four or more. The gas diffusion zone 37c is a disc-shaped space. The gas diffusion zone 37e is a ring-shaped space surrounding the gas diffusion zone 37c. The gas diffusion zone 37v is a ring-shaped space surrounding the gas diffusion space 37e. A plurality of gas holes 36b respectively communicating with the gas injection holes 34a extend downward from each of the gas diffusion zone 37c, the gas diffusion zone 37e, and the gas diffusion zone 37v.

The plasma processing apparatus 10 is provided with a gas box 40 for supplying various gases used for a plasma treatment. Further, a gas supply system 110 for supplying the gas supplied from the gas box 40 to each of the gas diffusion zones 37c, 37e, and 37v is connected to the electrode holder 36. The details of the gas supply system 110 will be described later.

The gas supplied to each of the gas diffusion zones 37c, 37e, and 37v is injected into the processing space S through the gas holes 36b and the gas injection holes 34a. By controlling the gas box 40 and the gas supply system 110, the plasma processing apparatus 10 can control the flow rate of the processing gas injected into the processing space S from the gas injection holes 34a of each of the gas diffusion zones 37c, 37e, and 37v.

At a lower portion in the processing chamber 12, a gas exhaust plate 48 is provided between the support portion 14 and an inner wall of the processing chamber 12. The gas exhaust plate 48 may be formed by, for example, coating an aluminum base with ceramic such as $Y_2O_3$. A gas exhaust port 12e is provided below the gas exhaust plate 48 in the processing chamber 12. A gas exhaust device 50 is connected to the gas exhaust port 12e through a gas exhaust line 52. The gas exhaust device 50 includes a vacuum pump such as a turbo molecular pump so that pressure in the processing chamber 12 can be reduced to a desired vacuum level. Further, a loading/unloading port 12g for the wafer W is provided at the sidewall of the processing chamber 12. The loading/unloading port 12g can be opened and closed by a gate valve 54.

The operation of the plasma processing apparatus 10 configured as described above is integrally controlled by a controller 100. The controller 100 is, for example, a computer and controls the individual components of the plasma processing apparatus 10. The operation of the plasma processing apparatus 10 is integrally controlled by the controller 100.

The controller 100 includes a CPU, a process controller 101 that controls the individual components of the plasma processing apparatus 10, a user interface 102, and a storage unit 103.

The user interface 102 includes a keyboard through which a process manager inputs commands to manage the plasma processing apparatus 10, a display for visualizing and displaying an operation status of the plasma processing apparatus 10, and the like.

The storage unit 103 stores therein control programs (software) for implementing various processes in the plasma processing apparatus 10 under the control of the process controller 101 and/or recipes including processing condition data and the like. Then, the process controller 101 calls and executes a certain recipe from the storage unit 103 according to an instruction inputted through the user interface 102, so that a desired process is performed in the plasma processing apparatus 10 under the control of the process controller 101. For example, the process controller 101 controls the individual components of the plasma processing apparatus 10 to execute a control method of the gas supply system 110 to be described later. Further, the control programs and the recipes having the processing condition data may be stored in a computer-readable storage medium (e.g., a hard disk, a CD, a flexible disk, a semiconductor memory, or the like). Alternatively, the control programs and the recipes having the processing condition data may be used online by frequently transmitting from other devices through e.g., a dedicated line.

Figure 2:
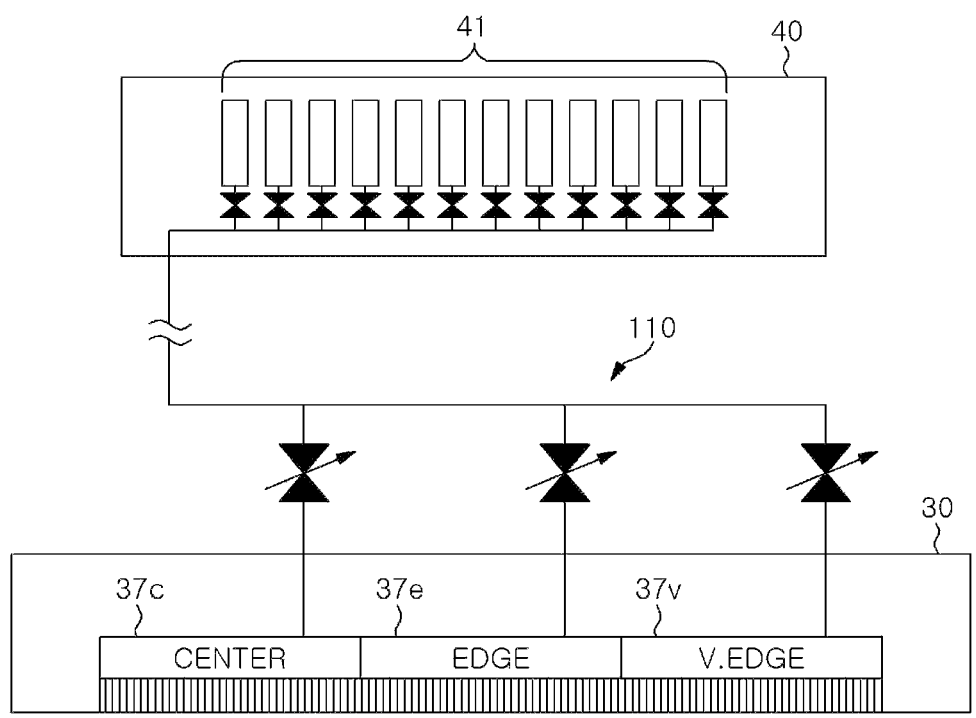
FIG. 2 shows an example of a schematic configuration of a gas supply system according to an embodiment.

Next, a configuration of the gas supply system according to the embodiment will be described. FIG. 2 shows an example of a schematic configuration of the gas supply system according to the embodiment. In the example of FIG. 2, the gas diffusion zones 37c, 37e, and 37v provided in the upper electrode 30 are illustrated in a simplified manner.

The gas box 40 has a gas source group 41 including various gas sources used for a plasma treatment such as plasma etching. The gas box 40 includes, for example, a valve and a flow rate controller (not shown) for each of the gas sources of the gas source group 41. Further, the gas box 40 is configured to supply one gas or a gas mixture of various gases as a processing gas depending on the plasma treatment.

The gas supply system 110 is configured to distribute the processing gas supplied from the gas box 40 to be supplied to the gas diffusion zones 37c, 37e, and 37v.

In the plasma processing apparatus 10, a plurality of processing gases may be switched to perform a plasma treatment. For example, in atomic layer etching, a step of adsorbing an adsorbate generated based on a first processing gas on an etching target film with plasma and a step of activating the adsorbate with a second processing gas are repeated to etch the wafer W.

Figure 3:
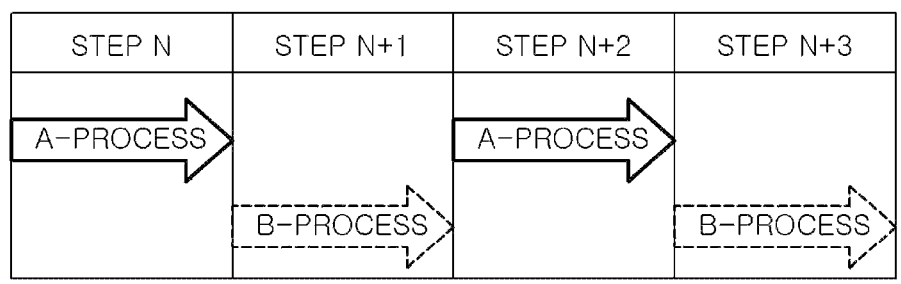
FIG. 3 shows an example of a schematic process of atomic layer etching according to the embodiment.

FIG. 3 shows an example of a schematic process of the atomic layer etching according to the embodiment. For example, in an A-process, the adsorbate generated based on the first processing gas is adsorbed on the wafer W. In a B-process, the adsorbate is activated by the second processing gas to etch the wafer W. In the atomic layer etching, the A-process and the B-process are repeated until the desired etching amount is obtained.

The gas supply system 110 according to the embodiment includes a plurality of supply paths for supplying the processing gas to the gas diffusion zones 37c, 37e, and 37v such that the processing gas can be stably and rapidly switched.

Figure 4:
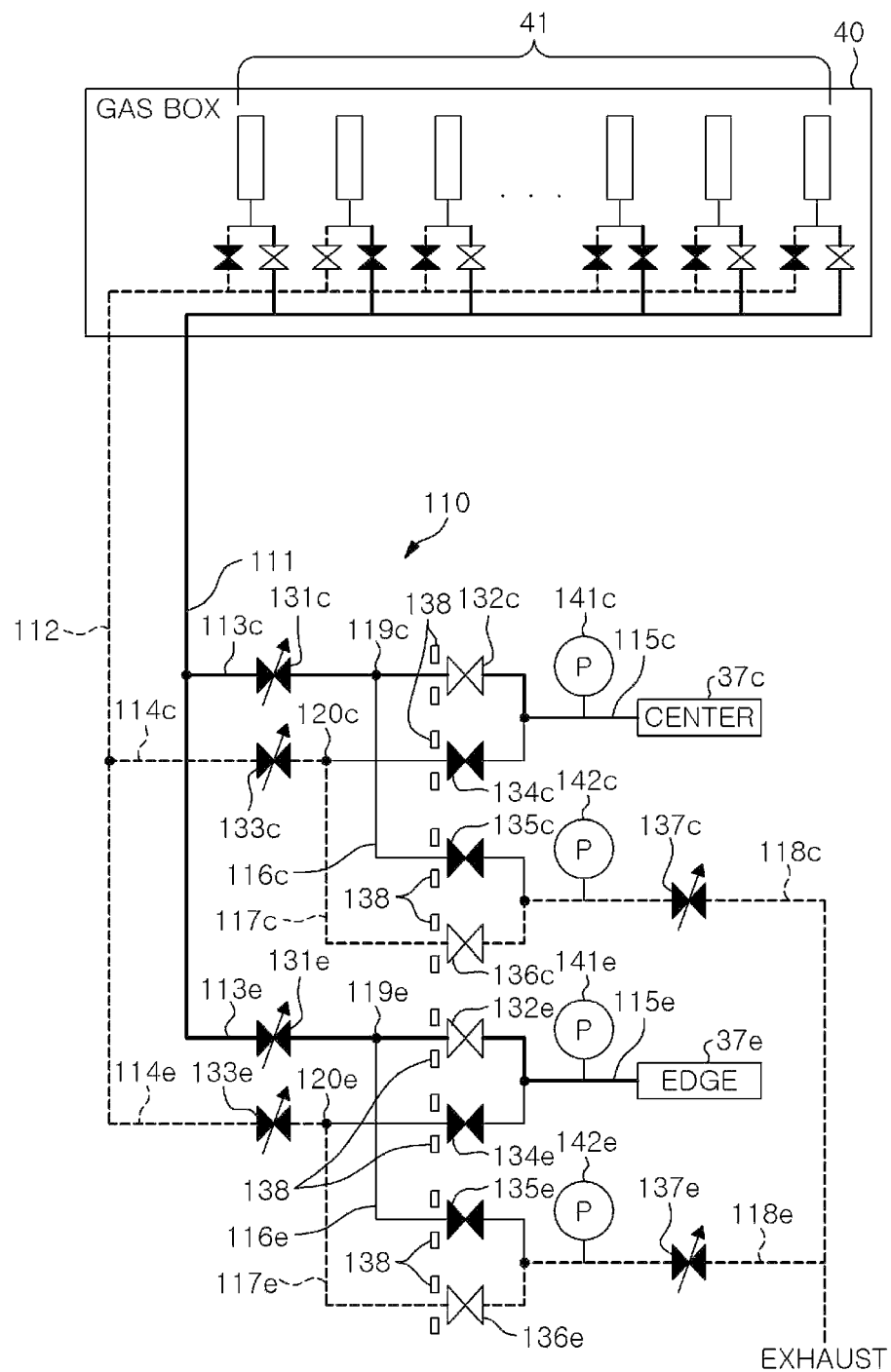
FIG. 4 shows an example of a schematic configuration of supply paths for a processing gas in the gas supply system according to the embodiment.

FIG. 4 shows an example of a schematic configuration of the supply paths for a processing gas in the gas supply system according to the embodiment. FIG. 4 shows the configuration of the supply paths for supplying the first processing gas and the second processing gas used for the atomic layer etching. In FIG. 4, for the sake of simplicity of description, only the supply paths for supplying the processing gas to the gas diffusion zones 37c and 37e are illustrated, and a supply path for supplying the processing gas to the gas diffusion zone 37v is omitted. The configuration of the supply path for supplying the processing gas to the gas diffusion zone 37v is similar to the supply path for supplying the processing gas to each of the gas diffusion zones 37c and 37e.

A gas supply line 111 and a gas supply line 112 are connected to the gas box 40. The gas box 40 supplies the first processing gas, which is one gas or a gas mixture of various gases, to the gas supply line 111. Further, the gas box 40 supplies the second processing gas, which is one gas or a gas mixture of various gases, to the gas supply line 112. For example, the first processing gas is a CF-based gas, and the second processing gas is a gas mixture in which a CF-based gas and a noble gas are mixed.

Each of the gas supply line 111 and the gas supply line 112 branches into the supply paths to the gas diffusion zones 37c, 37e, and 37v. In the example of FIG. 4, the gas supply line 111 branches into a gas supply line 113c and a gas supply line 113e. The gas supply line 112 branches into a gas supply line 114c and a gas supply line 114e.

The gas supply line 113c and the gas supply line 114c are connected to a common line 115c. The common line 115c is connected to the gas diffusion zone 37c. The gas supply line 113e and the gas supply line 114e are connected to a common line 115e. The common line 115e is connected to the gas diffusion zone 37e.

Further, a gas exhaust line 116c is branched from the gas supply line 113c on the way to the common line 115c. A gas exhaust line 116e is branched from the gas supply line 113e on the way to the common line 115e. A gas exhaust line 117c is branched from the gas supply line 114c on the way to the common line 115c. A gas exhaust line 117e is branched from the gas supply line 114e on the way to the common line 115e.

The gas exhaust line 116c and the gas exhaust line 117c are connected to a common line 118c. The gas exhaust line 116e and the gas exhaust line 117e are connected to a common line 118e. The common line 118c and the common line 118e are connected to a gas exhaust mechanism. The gas exhaust mechanism may be the gas exhaust device 50 or another gas exhaust device different from the gas exhaust device 50.

The first processing gas supplied to the gas supply line 111 is supplied to the gas supply line 113c and the gas supply line 113e. The first processing gas supplied to the gas supply line 113c flows through the common line 115c and reaches the gas diffusion zone 37c. Further, the first processing gas supplied to the gas supply line 113c reaches the gas exhaust mechanism through the gas exhaust line 116c and the common line 118c. The first processing gas supplied to the gas supply line 113e flows through the common line 115e and reaches the gas diffusion zone 37e. Further, the first processing gas supplied to the gas supply line 113e reaches the gas exhaust mechanism through the gas exhaust line 116e and the common line 118e.

The second processing gas supplied to the gas supply line 112 is supplied to the gas supply line 114c and the gas supply line 114e. The second processing gas supplied to the gas supply line 114c flows through the common line 115c and reaches the gas diffusion zone 37c. Further, the second processing gas supplied to the gas supply line 114c reaches the gas exhaust mechanism through the gas exhaust line 117c and the common line 118c. The second processing gas supplied to the gas supply line 114e flows through the common line 115e and reaches the gas diffusion zone 37e. Further, the second processing gas supplied to the gas supply line 114e reaches the gas exhaust mechanism through the gas exhaust line 117e and the common line 118e.

The gas supply line 113c is provided with a flow rate control valve 131c capable of adjusting an opening degree thereof at an upstream side of a branch point 119c where the gas exhaust line 116c is branched. Further, the gas supply line 113c is provided with a supply on/off valve 132c for switching an ON/OFF state of the gas supply line 113c at a downstream side of the branch point 119c. The supply on/off valve 132c is provided with an orifice 138 having a predetermined diameter.

The gas supply line 113e is provided with a flow rate control valve 131e capable of adjusting an opening degree thereof at an upstream side of a branch point 119e where the gas exhaust line 116e is branched. Further, the gas supply line 113e is provided with a supply on/off valve 132e for switching an ON/OFF state of the gas supply line 113e at a downstream side of the branch point 119e. The supply on/off valve 132e is provided with an orifice 138 having a predetermined diameter.

The common line 115c is provided with a pressure gauge 141c for measuring a pressure of the gas supplied to the gas diffusion zone 37c. The common line 115e is provided with a pressure gauge 141e for measuring a pressure of the gas supplied to the gas diffusion zone 37e.

The gas exhaust line 116c is provided with an exhaust on/off valve 135c for switching an ON/OFF state of the gas exhaust line 116c. The gas exhaust line 116e is provided with an exhaust on/off valve 135e for switching an ON/OFF state of the gas exhaust line 116e. Each of the exhaust on/off valve 135c and the exhaust on/off valve 135e is provided with an orifice 138 having a predetermined diameter.

The gas supply line 114c is provided with a flow rate control valve 133c capable of adjusting an opening degree thereof at an upstream side of a branch point 120c where the gas exhaust line 117c is branched. Further, the gas supply line 114c is provided with a supply on/off valve 134c for switching an ON/OFF state of the gas supply line 114c at a downstream side of the branch point 120c. The supply on/off valve 134c is provided with an orifice 138 having a predetermined diameter.

The gas supply line 114e is provided with a flow rate control valve 133e capable of adjusting an opening degree thereof at an upstream side of a branch point 120e where the gas exhaust line 117e is branched. Further, the gas supply line 114e is provided with a supply on/off valve 134e for switching an ON/OFF state of the gas supply line 114e at a downstream side of the branch point 120e. The supply on/off valve 134e is provided with an orifice 138 having a predetermined diameter.

The gas exhaust line 117c is provided with an exhaust on/off valve 136c for switching an ON/OFF state of the gas exhaust line 117c. The gas exhaust line 117e is provided with an exhaust on/off valve 136e for switching an ON/OFF state of the gas exhaust line 117e. Each of the exhaust on/off valve 136c and the exhaust on/off valve 136e is provided with an orifice 138 having a predetermined diameter.

The common line 118c is provided with a pressure gauge 142c for measuring a pressure of the gas flowing to the gas exhaust mechanism. Further, the common line 118c is provided with an exhaust flow rate control valve 137c capable of adjusting an opening degree thereof at a downstream side of the pressure gauge 142c.

The common line 118e is provided with a pressure gauge 142e for measuring a pressure of the gas flowing to the gas exhaust mechanism. Further, the common line 118e is provided with an exhaust flow rate control valve 137e capable of adjusting an opening degree thereof at a downstream side of the pressure gauge 142e.

Figure 5:
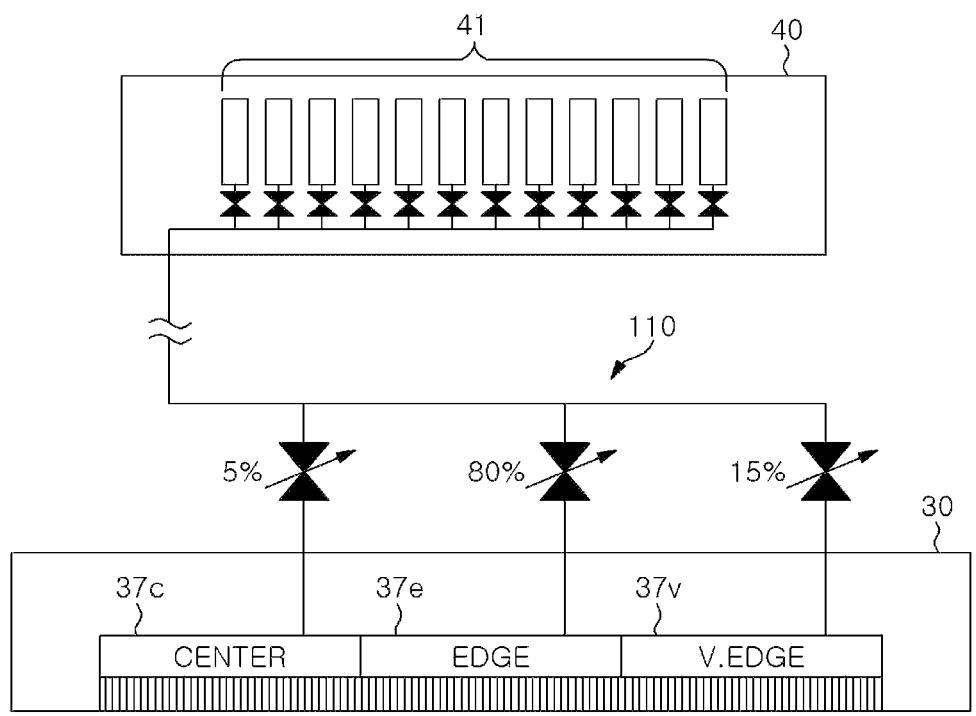
FIG. 5 shows an example of a processing gas ratio according to the embodiment.

In order to suppress the non-uniformity of the plasma treatment on the wafer W, the controller 100 controls the gas box 40 and the gas supply system 110 so that the processing gas flowing through each of the supply paths is supplied to the gas diffusion zones 37c, 37e, and 37v at a predetermined ratio. FIG. 5 shows an example of the ratio of the processing gas according to the embodiment. FIG. 5 shows an example of a split ratio of the processing gas that is supplied through one supply path to the gas diffusion chambers 37c, 37e, and 37v. The controller 100 controls the gas box 40 to supply the processing gas from the gas box 40 at a predetermined flow rate. Then, in the example of FIG. 5, the controller 100 controls the gas supply system 110 to split the flow rate of the processing gas supplied from the gas box 40 such that 5% of the processing gas is supplied to the gas diffusion zone 37c, 80% of the processing gas is supplied to the gas diffusion zone 37e, and 15% of the processing gas is supplied to the gas diffusion zone 37v. This flow split control of the processing gas will now be described.

Figure 6:
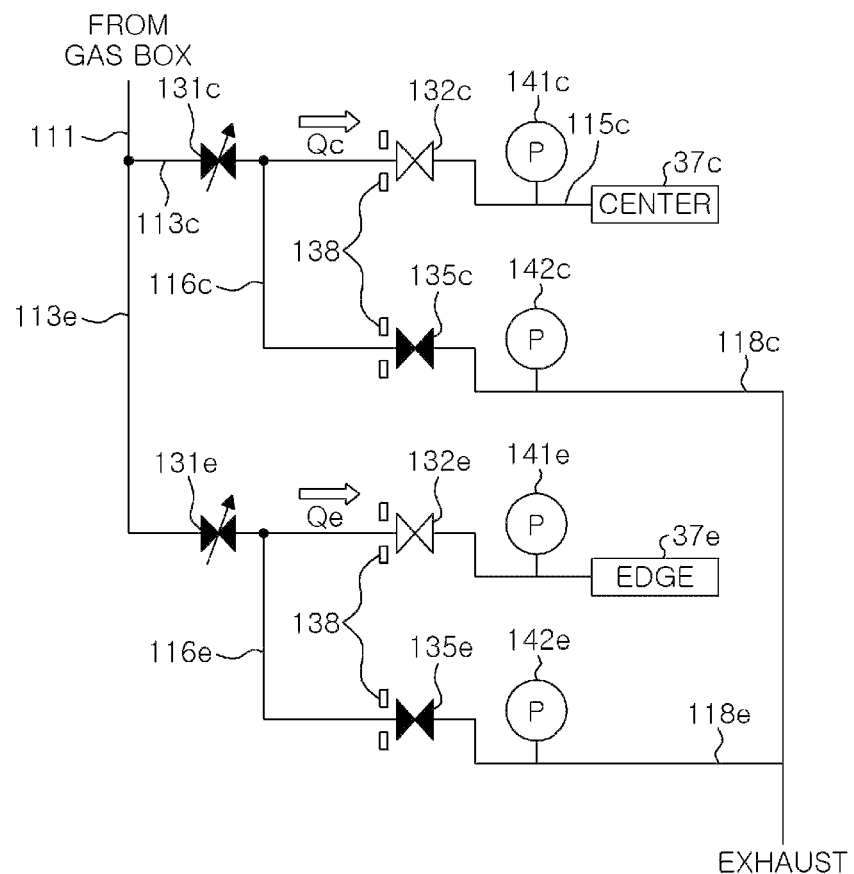
FIG. 6 shows an example of a flow split control of the processing gas according to the embodiment.

FIG. 6 shows an example of the flow split control of the processing gas according to the embodiment. In the example of FIG. 6, for the sake of simplicity of description, the supply paths for supplying the first processing gas to the gas diffusion zones 37c and 37e is illustrated.

When the flow rate control valves 131c and 131e are fully opened, the supply on/off valves 132c and 132e are opened, and the exhaust on/off valves 135c and 135e are closed, the first processing gas supplied from the gas box 40 is injected to the processing space S through the gas diffusion zones 37c and 37e. When the total flow rate of the first processing gas supplied from the gas box 40 is denoted by Q, the flow rate of the first processing gas supplied to the gas diffusion zone 37c is denoted by Qc, and the first processing gas supplied to the gas diffusion zone 37e is denoted by Qe, the following equation (1) is established for the flow rate.

$$Q = Qc + Qe \qquad \text{Eq. (1)}$$

The total flow rate Q can be controlled to a predetermined flow rate by the flow rate controller of the gas box 40. Thus, in the flow split control of the present embodiment, the flow rates Qc and Qe are controlled by controlling the flow rate ratio instead of controlling the specifically determined values therefor.

Figure 7:
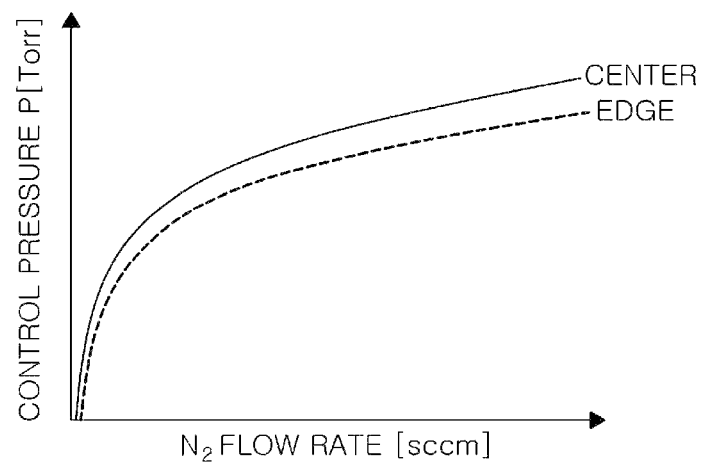
FIG. 7 shows an example of a relationship between a gas pressure and a flow rate according to the embodiment.

Here, in the gas diffusion zones 37c, 37e, and 37v, there is a corresponding relationship between the pressure of the supplied gas and the flow rate of the supplied gas. FIG. 7 shows an example of a relationship between a pressure and a flow rate of the gas according to the embodiment. FIG. 7 shows P-Q characteristics showing the relationship between the pressure (P) and the flow rate (Q) when $N_2$ gas is supplied. "Center" indicates the P-Q characteristics of the gas diffusion zone 37c. "Edge" indicates the P-Q characteristics of the gas diffusion zone 37e.

In the plasma processing apparatus 10, a gas is supplied to each of the gas diffusion zones 37c, 37e, and 37v in advance to acquire the relationship between the pressure and the flow rate of the gas. For example, in the plasma processing apparatus 10, $N_2$ gas is supplied from the gas box 40 to the gas diffusion zone 37c at various flow rates, and then the pressure is measured by the pressure gauge 141c for each flow rate. Thus, the relationship between the pressure and the flow rate is acquired. In the plasma processing apparatus 10, P-Q characteristic data for each of the gas diffusion zones 37c, 37e, and 37v is generated from the acquired relationship between the pressure and the flow rate, and the generated P-Q characteristic data is stored in the storage unit 103. The P-Q characteristic data may be stored in the storage unit 103 from an external source.

Here, in the plasma processing apparatus 10 according to the present embodiment, the supply on/off valves 132c, 132e, 134c, and 134e and the exhaust on/off valves 135c, 135e, 136c, and 136e are provided with the orifices 138, respectively. Each orifice 138 is provided to prevent the flow rate controller of the gas box 40 from being affected by conductance on the upper electrode 30 side. If the diameter of the orifice 138 is excessively reduced, a pressure of the secondary side of the flow rate controller of the gas box 40 will increase. Therefore, there is a limit to the amount of diameter reduction. In each of the gas diffusion zones 37c, 37e, and 37v, when the diameter of the orifice 138 is small, a difference in P-Q characteristics may occur due to the influence of the pressure of the secondary side. Therefore, it is preferable to store the P-Q characteristic data of each of the gas diffusion zones 37c, 37e, and 37v.

The controller 100 controls the gas box 40 and the gas supply system 110 so that the processing gas is supplied to the gas diffusion zones 37c, 37e, and 37v at a predetermined ratio. For example, the process controller 101 controls the gas box 40 to supply one gas or a gas mixture of various gases mixed at respective predetermined flow rates. The process controller 101 obtains the total flow rate of the processing gas. For example, when the gas box 40 supplies the processing gas in which the gases A, B, and C are mixed at the following flow rates, the total flow rate of the processing gas is as follows:

Gas A: Flow rate 350 sccm
Gas B: Flow rate 150 sccm
Gas C: Flow rate 100 sccm
Total flow rate: 600 sccm.

The process controller 101 obtains the split flow rates of the processing gas supplied to the gas diffusion zones 37c, 37e, and 37v when the total flow rate of the processing gas, which is supplied to the gas diffusion zones 37c, 37e, and 37v, is divided into a predetermined split ratio. For example, when the processing gas supplied from the gas box 40 is split into the gas diffusion zone 37c and the gas diffusion zone 37e at the split ratio of 80:20, the processing gas is supplied to the gas diffusion zone 37c at 480 sccm, and the processing gas is supplied to the gas diffusion zone 37e at 120 sccm.

The process controller 101 obtains, from the P-Q characteristic data stored in the storage unit 103, the pressure of the processing gas in each of the gas diffusion zones 37c, 37e, and 37v when supplying the processing gas at the determined split flow rates to the gas diffusion zones 37c, 37e, and 37v. Then, the process controller 101 obtains the pressure ratio of the processing gas in the gas diffusion zones 37c, 37e, and 37v. For example, in the P-Q characteristic data, the pressure is 40 Torr when the gas is supplied to the gas diffusion zone 37c at 480 sccm, and the pressure is 12 Torr when the gas is supplied to the gas diffusion zone 37e at 120 sccm. Thus, the pressure ratio of the gas diffusion zone 37c to the gas diffusion zone 37e is 3.33 (=40/12).

The process controller 101 performs pressure ratio control so that the processing gas is supplied to the gas diffusion zones 37c, 37e, and 37v at the obtained pressure ratio. For example, the process controller 101 controls the opening degrees of the flow rate control valves 131c and 131e so that the pressure ratio of the gas diffusion zone 37c to the gas diffusion zone 37e measured by the pressure gauges 141c and 141e becomes 3.33. For example, the process controller 101 controls the opening degrees of the flow rate control valves 131c and 131e so that the pressure of the gas diffusion zone 37e becomes 20 Torr when the pressure of the gas diffusion zone 37c is 66 Torr.

As described above, in the plasma processing apparatus 10, the processing gas can be supplied to the gas diffusion zones 37c, 37e, and 37v at a predetermined ratio by performing pressure ratio control.

The controller 100 performs a plasma treatment(s) by switching the processing gas(es) while controlling the pressure ratio of the processing gas for each supply path. For example, when the atomic layer etching is performed, the process controller 101 controls the gas supply system 110 to alternately supply the first processing gas and the second processing gas while performing pressure ratio control such that each of the first processing gas and the second processing gas is supplied at a predetermined ratio.

Figure 8A:
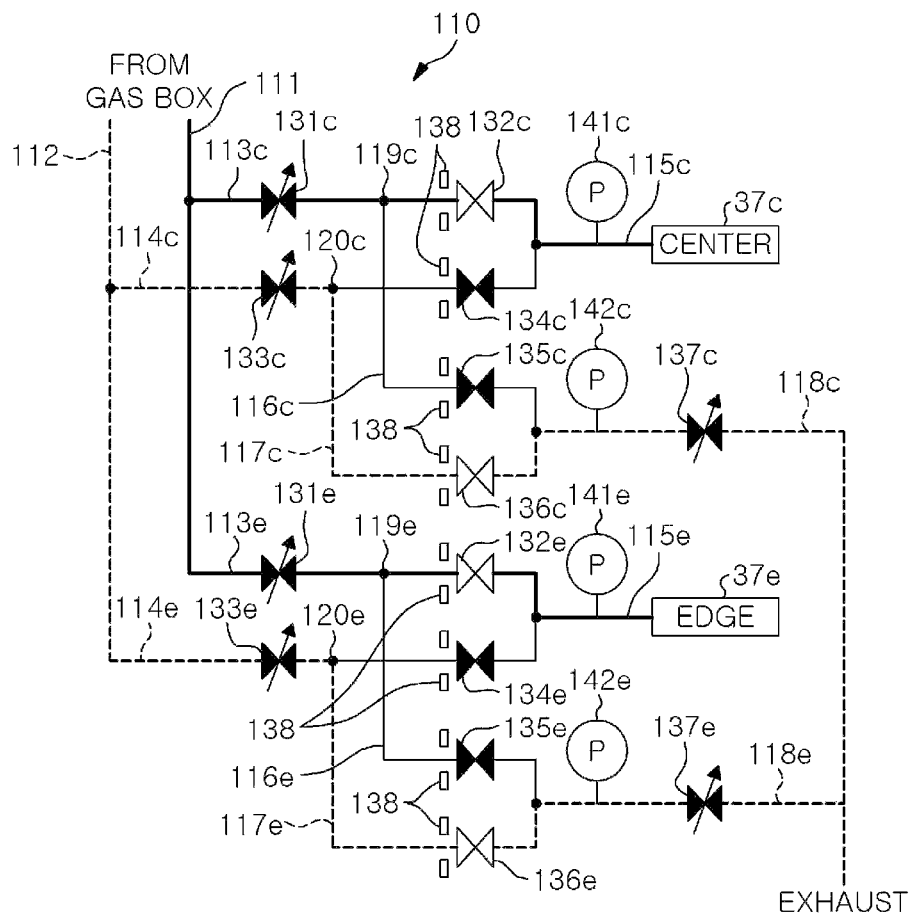
FIG. 8A shows a switching operation in the gas supply system according to the embodiment.
Figure 8B:
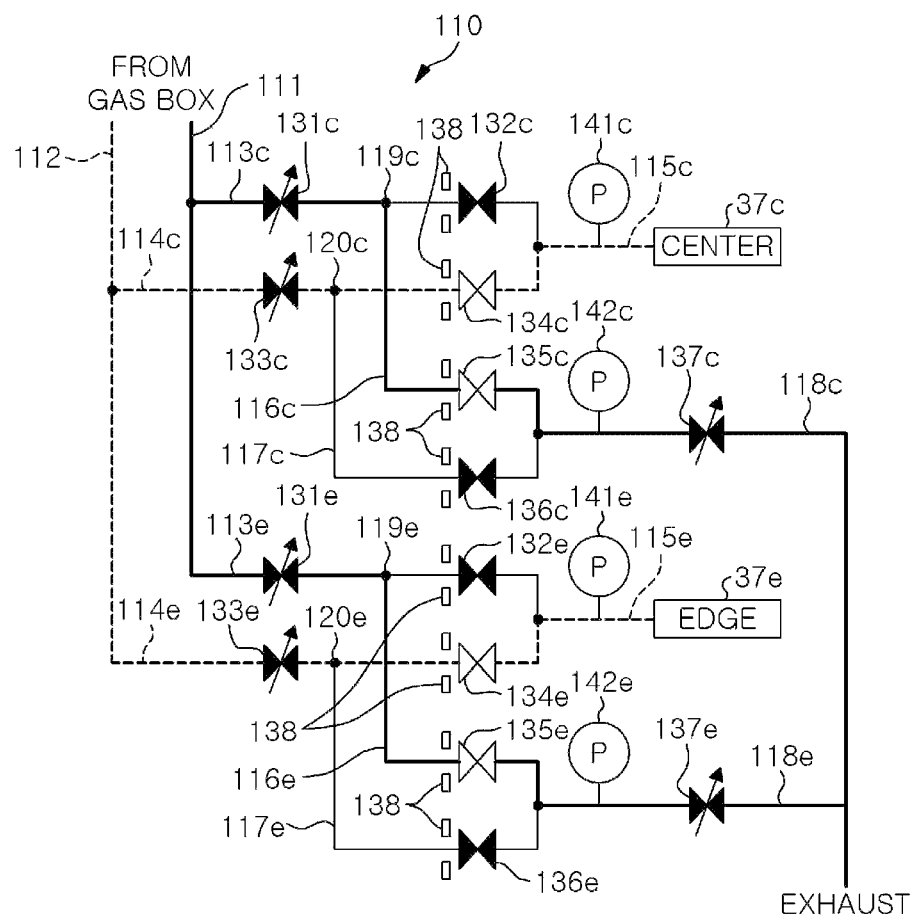
FIG. 8B shows the switching operation in the gas supply system according to the embodiment.

FIGS. 8A and 8B show a switching operation of the gas supply system according to the embodiment. FIGS. 8A and 8B show the configurations of the supply paths for supplying the first processing gas and the second processing gas used for atomic layer etching. In the examples of FIGS. 8A and 8B, for the sake of simplicity of description, only the supply paths for supplying the processing gas to the gas diffusion zones 37c and 37e are illustrated, and the supply path for supplying the processing gas to the gas diffusion zone 37v is omitted.

FIG. 8A shows a case where the first processing gas is supplied to the gas diffusion zones 37c and 37e. FIG. 8B shows a case where the second processing gas is supplied to the gas diffusion zones 37c and 37e. When the first processing gas is supplied to the gas diffusion zones 37c and 37e, the process controller 101 controls the supply on/off valves 132c and 132e and the exhaust on/off valves 136c and 136e to be opened, as shown in FIG. 8A. Further, the process controller 101 controls the supply on/off valves 134c and 134e and the exhaust on/off valves 135c and 135e to be closed. As a result, the first processing gas is supplied to the gas diffusion zones 37c and 37e. Further, the second processing gas is exhausted.

The process controller 101 controls the opening degrees of the flow rate control valves 131c and 131e through pressure ratio control based on the pressures of the first processing gas measured by the pressure gauges 141c and 141e. Further, the process controller 101 controls the opening degrees of the flow rate control valves 133c and 133e through pressure ratio control based on the pressures of the second processing gas measured by the pressure gauges 142c and 142e.

When the gas supplied to the gas diffusion zones 37c and 37e is switched from the first processing gas to the second processing gas, the process controller 101 switches the supply on/off valves 132c and 132e and the exhaust on/off valves 136c and 136e from the open state to the closed state. Further, the process controller 101 switches the supply on/off valves 134c and 134e and the exhaust on/off valves 135c and 135e from the closed state to the open state. As a result, as shown in FIG. 8B, the second processing gas is supplied to the gas diffusion zones 37c and 37e, and the first processing gas is exhausted.

The process controller 101 controls the opening degrees of the flow rate control valves 133c and 133e through pressure ratio control based on the pressures of the second processing gas measured by the pressure gauges 141c and 141e. Further, the process controller 101 controls the opening degrees of the flow rate control valves 131c and 131e through pressure ratio control based on the pressures of the first processing gas measured by the pressure gauges 142c and 142e.

The process controller 101 switches the supply on/off valves 134c and 134e and the exhaust on/off valves 135c and 135e from the open state to the closed state when the gas supplied to the gas diffusion zones 37c and 37e is switched from the second processing gas to the first processing gas. Further, the process controller 101 switches the supply on/off valves 132c and 132e and the exhaust on/off valves 136c and 136e from the closed state to the open state. As a result, as shown in FIG. 8A, the first processing gas is supplied to the gas diffusion zones 37c and 37e, and the second processing gas is exhausted.

Here, in the gas supply system 110 according to the present embodiment, when the ON/OFF switching of the supply on/off valves 132c and 132e and the ON/OFF switching of the supply on/off valves 134c and 134e are performed simultaneously, there is a possibility that the supply paths of the first processing gas and the second processing gas become connected to each other. Therefore, when the ON/OFF switching of the supply on/off valves 132c and 132e and the ON/OFF switching of the supply on/off valves 134c and 134e are performed, it is preferable to include a delay time when switching so that there is a period in which both of the supply on/off valves 132c and 132e and the supply on/off valves 134c and 134e are in the closed state.

When the gas supplied to the gas diffusion zones 37c and 37e is switched from the first processing gas to the second processing gas, the process controller 101 provides the period in which both of the supply on/off valves 132c and 132e and the supply on/off valves 134c and 134e are in the closed state. For example, the process controller 101 first switches the supply on/off valves 132c and 132e from the open state to the closed state, and then switches the supply on/off valves 134c and 134e from the closed state to the open state. Further, the process controller 101 also provides the period in which both of the supply on/off valves 132c and 132e and the supply on/off valves 134c and 134e are in the closed state when switching the gas supplied to the gas diffusion zones 37c and 37e from the second processing gas to the first processing gas. For example, the process controller 101 first switches the supply on/off valves 134c and 134e from the open state to the closed state, and then switches the supply on/off valves 132c and 132e from the closed state to the open state.

Meanwhile, in the case of performing the switching between the first processing gas and the second processing gas, a backflow of a switched-out processing gas (a previously supplied processing gas) may occur due to the pressure difference when a pressure of the switched-out processing gas that remains on the upper electrode 30 side is higher than a pressure of a switched-in processing gas (a currently switched processing gas).

Figure 9A:
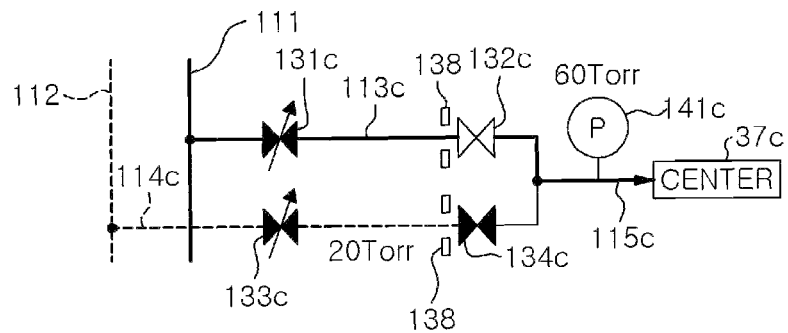
FIG. 9A shows a backflow of a processing gas.
Figure 9B:
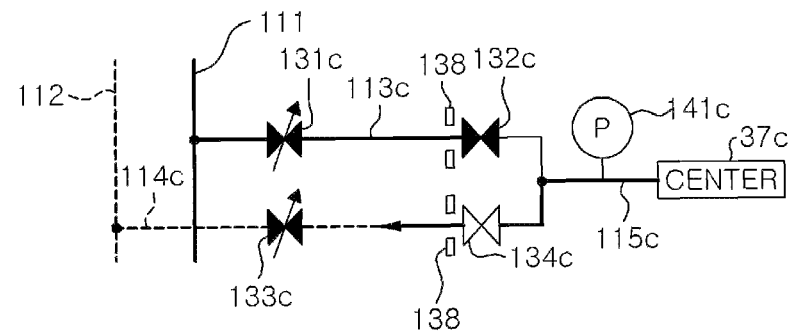
FIG. 9B shows the backflow of a processing gas.
Figure 9C:
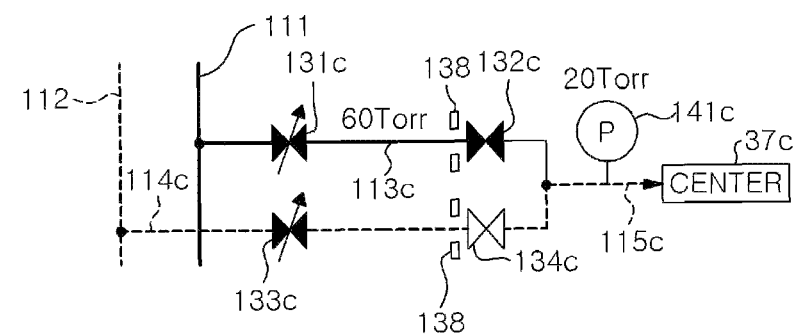
FIG. 9C shows the backflow of a processing gas.

FIGS. 9A to 9C are views for explaining the backflow of the processing gas. For example, as shown in FIG. 9A, the first processing gas at a pressure of 60 Torr is supplied to the gas diffusion zone 37c. Pressure ratio control is performed for the second processing gas so that the second processing gas at a pressure of 20 Torr is to be supplied. At the switching timing, the supply on/off valve 132c is switched from the open state to the closed state and the supply on/off valve 134c is switched from the closed state to the open state. In this case, the pressure difference causes the backflow of the first processing gas to the gas supply line 114c, as shown in FIG. 9B. The second processing gas allows the first processing gas flowing back to the gas supply line 114c to flow into the gas diffusion zone 37c, and thereafter the second processing gas at a pressure of 20 Torr is supplied into the gas diffusion zone 37c, as shown in FIG. 9C. Thus, when the backflow of the first processing gas occurs as described above, the pressure ratio of the second processing gas changes.

Therefore, when the switching between the first processing gas and the second processing gas is performed, the controller 100 controls the gas supply system 110 such that an initial pressure of the switched-in processing gas is equal to or higher than a pressure of the switched-out processing gas that remains on the upper electrode 30 side.

Figure 10A:
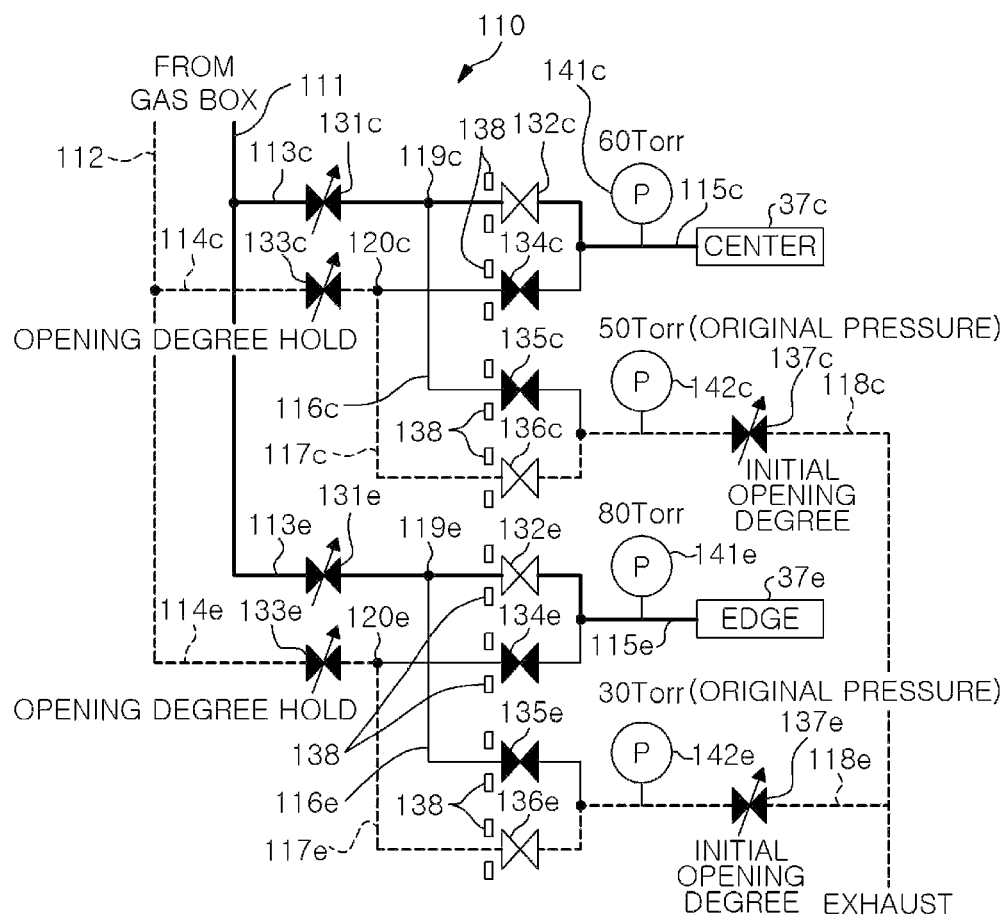
FIG. 10A shows an example of pressure control for the switching operation in the gas supply system according to the embodiment.
Figure 10B:
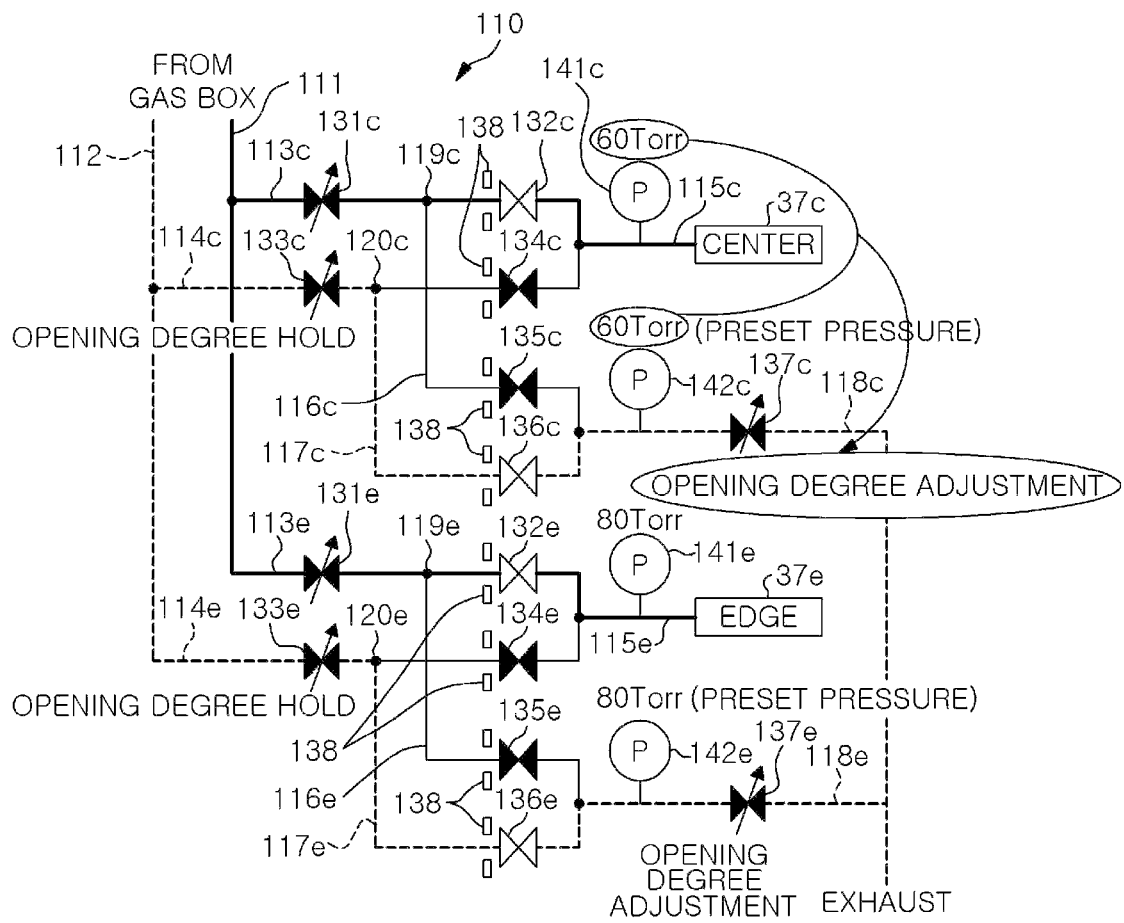
FIG. 10B shows an example of pressure control for the switching operation in the gas supply system according to the embodiment.

FIGS. 10A and 10B show an example of a pressure control in the switching operation of the gas supply system according to the embodiment. FIGS. 10A and 10B show the configuration of the supply paths for supplying the first processing gas and the second processing gas used for the atomic layer etching. In the examples of FIGS. 10A and 10B, for the sake of simplicity of description, only the supply paths for supplying the processing gas to the gas diffusion zones 37c and 37e are illustrated, and the supply path for supplying the processing gas to the gas diffusion zone 37v is omitted.

In the example of FIG. 10A, the pressure of the first processing gas is controlled through pressure ratio control such that the pressure of the first processing gas measured by the pressure gauge 141c is 60 Torr and the pressure of the first processing gas measured by the pressure gauge 141e is 80 Torr.

When the gas supplied to the gas diffusion zones 37c and 37e is switched from the first processing gas to the second processing gas, the process controller 101 controls the exhaust flow rate control valves 137c and 137e to have predetermined initial opening degrees, respectively. Each initial opening degree is set to an opening degree at which the same characteristics as the exhaust characteristics of the upper electrode 30 are obtained. For example, the initial opening degree of the exhaust flow rate control valve 137c is set such that a conductance, which is substantially the same as a conductance when injecting the gas from the gas diffusion zone 37c, is obtained. The initial opening degree of the exhaust flow rate control valve 137e is set such that a conductance, which is substantially the same as a conductance when injecting the gas from the gas diffusion zone 37e, is obtained. The initial opening degrees are measured and stored in the storage unit 103 in advance.

The process controller 101 controls the opening degrees of the flow rate control valves 133c and 133e through pressure ratio control based on the pressures of the second processing gas measured by the pressure gauges 142c and 142e. Accordingly, as shown in FIG. 10A, the pressure of the second processing gas measured by the pressure gauge 142c becomes 50 Torr, and the pressure of the second processing gas measured by the pressure gauge 142e becomes 30 Torr. By performing pressure ratio control for the exhaust flow rate control valves 137c and 137e to have the initial opening degrees, the opening degrees of the flow rate control valves 133c and 133e can be adjusted such that the same conductance as the conductance when supplying the second processing gas to the gas diffusion zones 37c and 37e is obtained. Therefore, even when the gas supplied to the gas diffusion zones 37c and 37e is switched from the first processing gas to the second processing gas, the second processing gas can be stably supplied to the gas diffusion zones 37c and 37e (and 37v) at a predetermined ratio.

Thereafter, the process controller 101 performs an opening degree adjustment for closing the exhaust flow rate control valves 137c and 137e or changing the opening degrees of the exhaust flow rate control valves 137c and 137e to small degrees. By closing the exhaust side or reducing the opening degree of the exhaust side, the pressures of the second processing gas increase at the upstream sides of the exhaust flow rate control valves 137c and 137e in the supply paths of the second processing gas. For example, as shown in FIG. 10B, the pressure of the second processing gas measured by the pressure gauge 142c is increased to 60 Torr and the pressure of the second processing gas measured by the pressure gauge 142e is increased to 80 Torr. When the pressures of the pressure gauges 142c and 142e become equal to or higher than the pressures of the pressure gauges 141c and 141e, respectively, the process controller 101 switches the supply on/off valves 132c and 132e from the open state to the closed state and switches the supply on/off valves 134c and 134e from the closed state to the open state. For example, as shown in FIG. 10B, the process controller 101 performs the switching control when the pressures of the pressure gauges 142c and 142e become equal to the pressures of the pressure gauges 141c and 141e, respectively.

On the other hand, when the gas supplied to the gas diffusion zones 37c and 37e is switched from the second processing gas to the first processing gas, the process controller 101 controls the exhaust flow rate control valves 137c and 137e to have the initial opening.

The process controller 101 controls the opening degrees of the flow rate control valves 131c and 131e through pressure ratio control based on the pressures of the first processing gas measured by the pressure gauges 142c and 142e. Thereafter, the process controller 101 performs an opening degree adjustment for closing the exhaust flow rate control valves 137c and 137e or changing the opening degrees of the exhaust flow rate control valves 137c and 137e to small degrees. By closing the exhaust side or reducing the opening degree of the exhaust side, the pressures of the first processing gas increase at the upstream sides of the exhaust flow rate control valves 137c and 137e in the supply paths of the first processing gas. When the pressures of the pressure gauges 142c and 142e becomes equal to or higher than the pressures of the pressure gauges 141c and 141e, respectively, the process controller 101 performs the switching control to switch the supply on/off valves 134c and 134e from the open state to the closed state and switch the supply on/off valves 132c and 132e from the closed state to the open state.

Therefore, when the switching between the first processing gas and the second processing gas is performed, it is possible to suppress the occurrence of the backflow of the switched-out processing gas.

The controller 100 may control the gas supply system 110 such that the initial pressure of the switched-in processing gas is sufficiently higher than the pressure of the switched-out processing gas that remains on the upper electrode 30 side.

Figure 11:
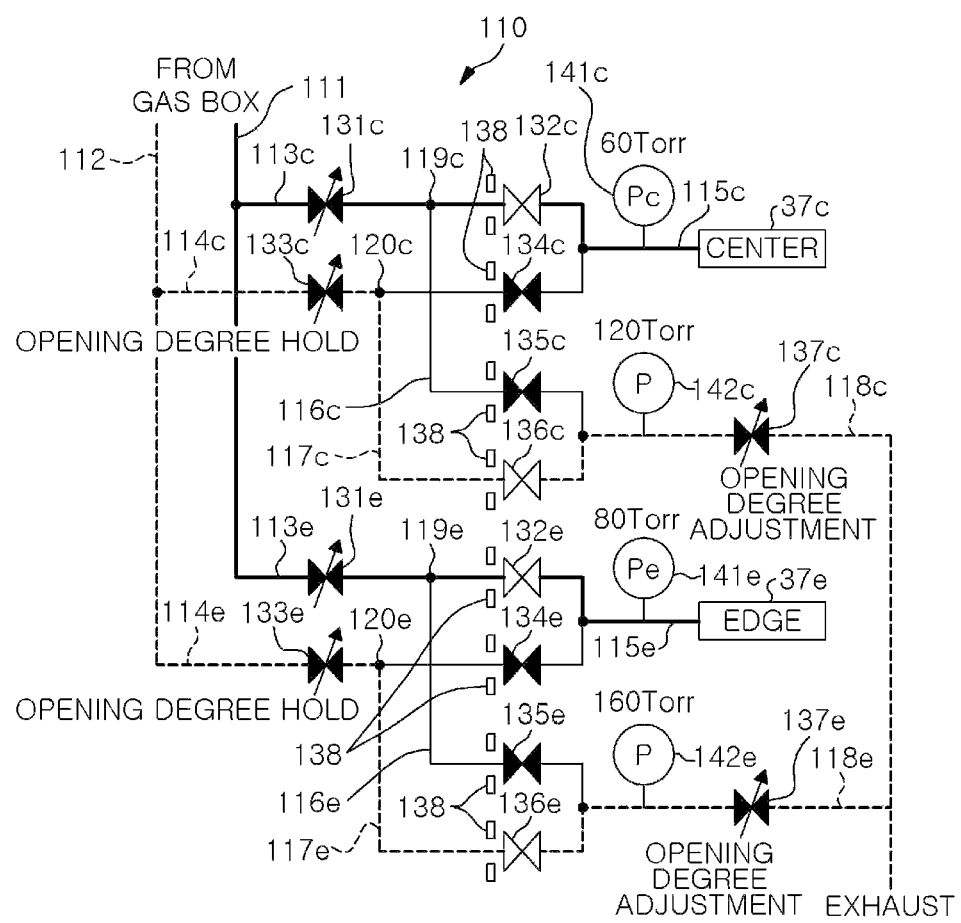
FIG. 11 shows an example of pressure control for the switching operation in the gas supply system according to the embodiment.

FIG. 11 shows an example of a pressure control in the switching operation of the gas supply system according to the embodiment. FIG. 11 shows the configuration of the supply paths for supplying the first processing gas and the second processing gas used for the atomic layer etching. In the example of FIG. 11, for the sake of simplicity of description, only the supply paths for supplying the processing gas to the gas diffusion zones 37c and 37e are illustrated, and the supply path for supplying the processing gas to the gas diffusion zone 37v is omitted.

For example, the process controller 101 controls the opening degrees of the flow rate control valves 133c and 133e through pressure ratio control based on the pressures of the second processing gas measured by the pressure gauges 142c and 142e. Thereafter, the process controller 101 performs an opening degree adjustment for closing the exhaust flow rate control valves 137c and 137e or changing the opening degrees of the exhaust flow rate control valves 137c and 137e to small degrees. By closing the exhaust side or reducing the opening degree of the exhaust side, the pressures of the second processing gas increase at the upstream sides of the exhaust flow rate control valves 137c and 137e in the supply paths of the second processing gas. When the pressures of the pressure gauges 142c and 142e become a predetermined multiple of the pressures of the pressure gauges 141c and 141e, respectively, the process controller 101 performs the switching control. For example, as shown in FIG. 11, the process controller 101 performs the switching control at the timing when the pressures P of the pressure gauges 142c and 142e respectively become twice the pressure Pc of the pressure gauge 141c and the pressure Pe of the pressure gauge 141e.

The relationship between the pressure P and the pressure Pc is defined by the following equation (2):

$$Pc \times Vc = \alpha \times P \times V \qquad \text{Eq. (2)}$$

where Vc is the volume of the gas diffusion zone 37c and V is the volume of the gas exhaust line.

In the equation (2), α is a parameter of the index of the gas supply rate and is set to have a value larger than 1, for example.

Therefore, when the switching between the first processing gas and the second processing gas is performed, the switched-in processing gas can be rapidly injected from the upper electrode 30. Further, a period during which the switched-out processing gas remains in the upper electrode 30 can be shortened.

(Control Method of the Gas Supply System)

Next, an example of a control flow of the control method of the gas supply system 110 executed by the plasma processing apparatus 10 will be described. FIGS. 12A to 12G show an example of the control flow of the control method of the gas supply system according to the embodiment. In the examples of FIGS. 12A to 12G, for the sake of simplicity of description, only the supply paths for supplying the processing gas to the gas diffusion zones 37c and 37e are illustrated, and the supply path for supplying the processing gas to the gas diffusion zone 37v is omitted. FIGS. 12A to 12G show the flow of switching the gas supplied to the gas diffusion zones 37c and 37e from the first processing gas to the second processing gas.

When the first processing gas is supplied to the gas diffusion zones 37c and 37e, the process controller 101 controls the valves of the gas supply system 110 as follows (step S1):
Flow rate control valve 131c: Pressure ratio control
Flow rate control valve 133c: No control
Flow rate control valve 131e: Pressure ratio control
Flow rate control valve 133e: No control
Supply on/off valve 132c: Open state
Exhaust on/off valve 135c: Closed state
Supply on/off Valve 132e: Open state
Exhaust on/off valve 135e: Closed state
Supply on/off valve 134c: Closed state
Exhaust on/off valve 136c: Closed state
Supply on/off valve 134e: Closed state
Exhaust on/off valve 136e: Closed state
Exhaust flow rate control valve 137c: Initial opening degree
Exhaust Flow rate control valve 137e: initial opening degree.

Figure 12A:
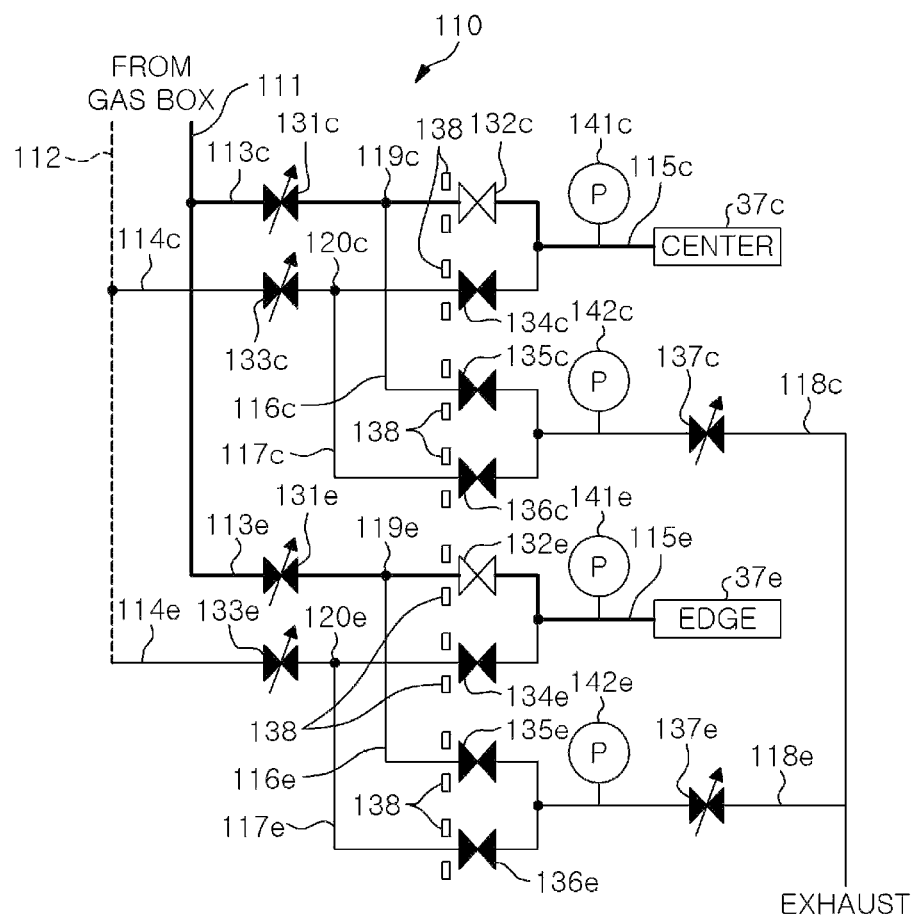
FIG. 12A shows an example of control flow of a control method for the gas supply system according to the embodiment.

FIG. 12A shows the states of the valves of the gas supply system 110 in step S1. In step S1, the first processing gas is supplied to the gas diffusion zones 37c and 37e.

When the gas supplied to the gas diffusion zones 37c and 37e is switched from the first processing gas to the second processing gas, the process controller 101 controls the valves of the gas supply system 110 as follows (step S2):
Flow rate control valve 131c: Pressure ratio control
Flow rate control valve 133c: Pressure ratio control
Flow rate control valve 131e: Pressure ratio control
Flow rate control valve 133e: Pressure ratio control
Supply on/off valve 132c: Open state
Exhaust on/off valve 135c: Closed state
Supply on/off Valve 132e: Open state
Exhaust on/off valve 135e: Closed state
Supply on/off valve 134c: Closed state
Exhaust on/off valve 136c: Open state
Supply on/off valve 134e: Closed state
Exhaust on/off valve 136e: Open state
Exhaust flow rate control valve 137c: Initial opening degree
Exhaust Flow rate control valve 137e: initial opening degree.

Figure 12B:
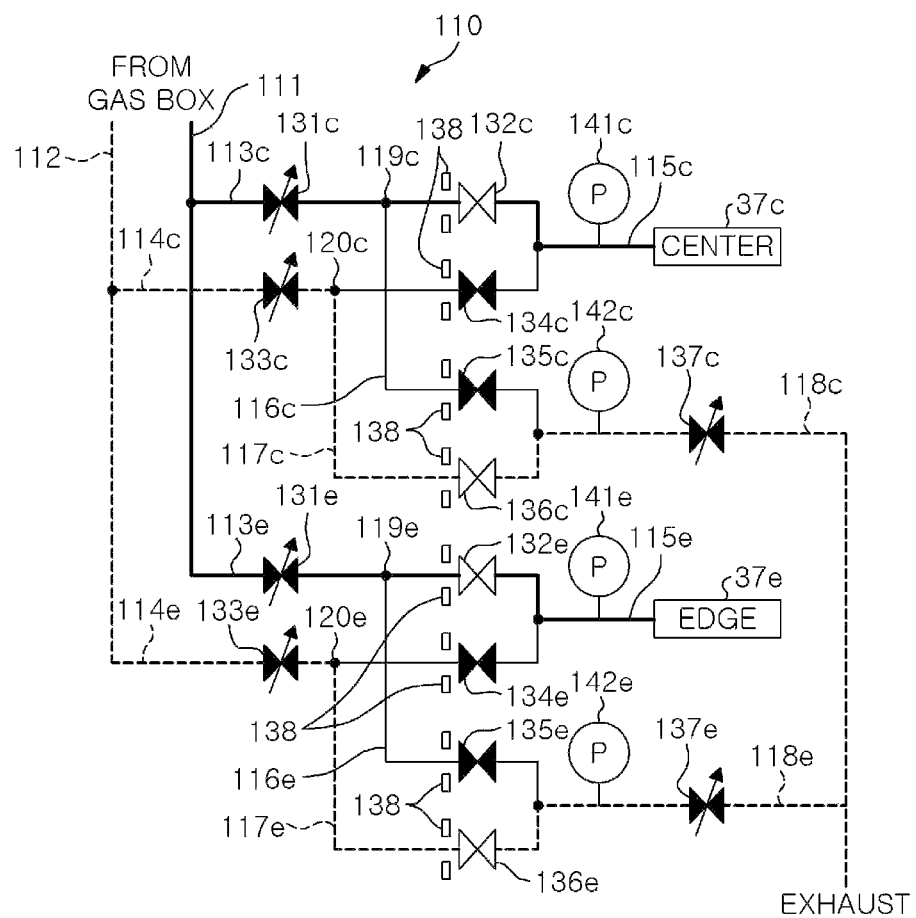
FIG. 12B shows an example of the control flow of the control method for the gas supply system according to the embodiment.

FIG. 12B shows the states of the valves of the gas supply system 110 in step S2. In step S2, the opening degrees of the flow rate control valves 133c and 133e are adjusted by pressure ratio control while the second processing gas is exhausted, so that the second processing gas is supplied at a predetermined ratio.

Next, the process controller 101 controls the valves of the gas supply system 110 as follows (step S3):
Flow rate control valve 131c: Pressure ratio control
Flow rate control valve 133c: Fixing opening degree when pressure ratio control is stable
Flow rate control valve 131e: Pressure ratio control
Flow rate control valve 133e: Fixing opening degree when pressure ratio control is stable
Supply on/off valve 132c: Open state
Exhaust on/off valve 135c: Closed state
Supply on/off Valve 132e: Open state
Exhaust on/off valve 135e: Closed state
Supply on/off valve 134c: Closed state
Exhaust on/off valve 136c: Open state
Supply on/off valve 134e: Closed state
Exhaust on/off valve 136e: Open state
Exhaust flow rate control valve 137c: Initial opening degree
Exhaust Flow rate control valve 137e: initial opening degree.

Figure 12C:
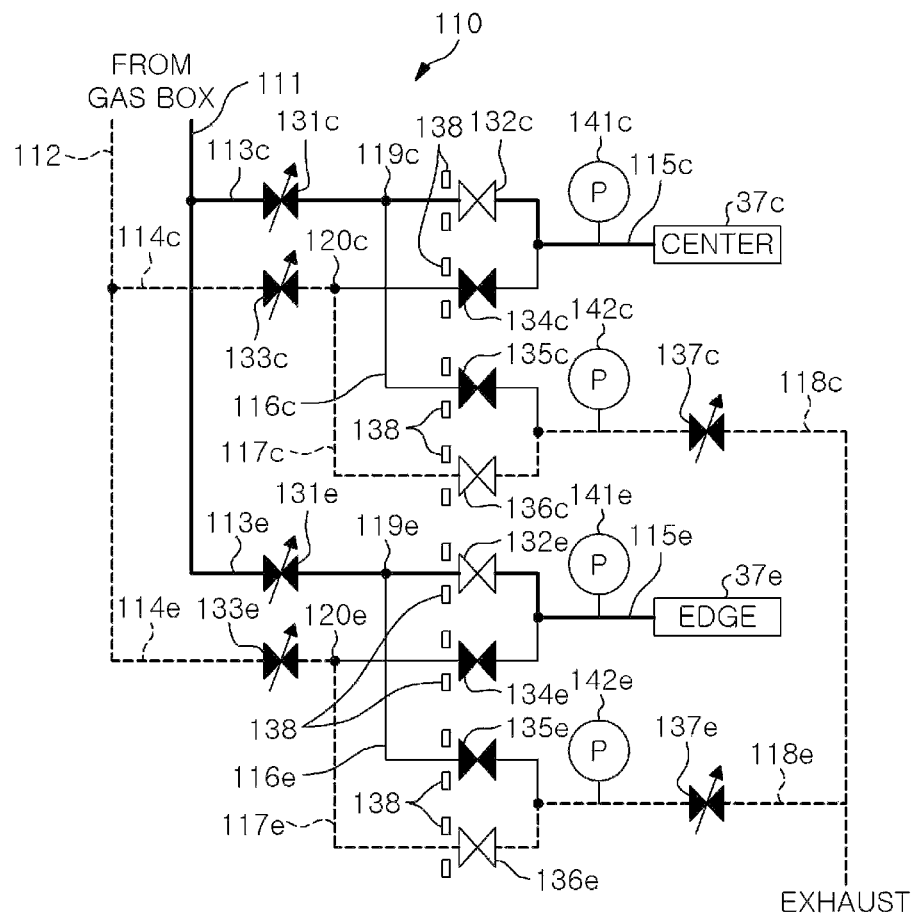
FIG. 12C shows an example of the control flow of the control method for the gas supply system according to the embodiment.

FIG. 12C shows the states of the valves of the gas supply system 110 in step S3. In step S3, the opening degrees of the flow rate control valves 133c and 133e are fixed in a state where the second processing gas is supplied at the predetermined ratio.

Next, the process controller 101 controls the valves of the gas supply system 110 as follows (step S4):
Flow rate control valve 131c: Pressure ratio control
Flow rate control valve 133c: Fixing opening degree
Flow rate control valve 131e: Pressure ratio control
Flow rate control valve 133e: Fixing opening degree
Supply on/off valve 132c: Open state
Exhaust on/off valve 135c: Closed state
Supply on/off Valve 132e: Open state
Exhaust on/off valve 135e: Closed state
Supply on/off valve 134c: Closed state
Exhaust on/off valve 136c: Open state
Supply on/off valve 134e: Closed state
Exhaust on/off valve 136e: Open state
Exhaust flow rate control valve 137c: Closed state or changing to smaller opening degree Exhaust Flow rate control valve 137e: Closed state or changing to smaller opening degree.

Figure 12D:
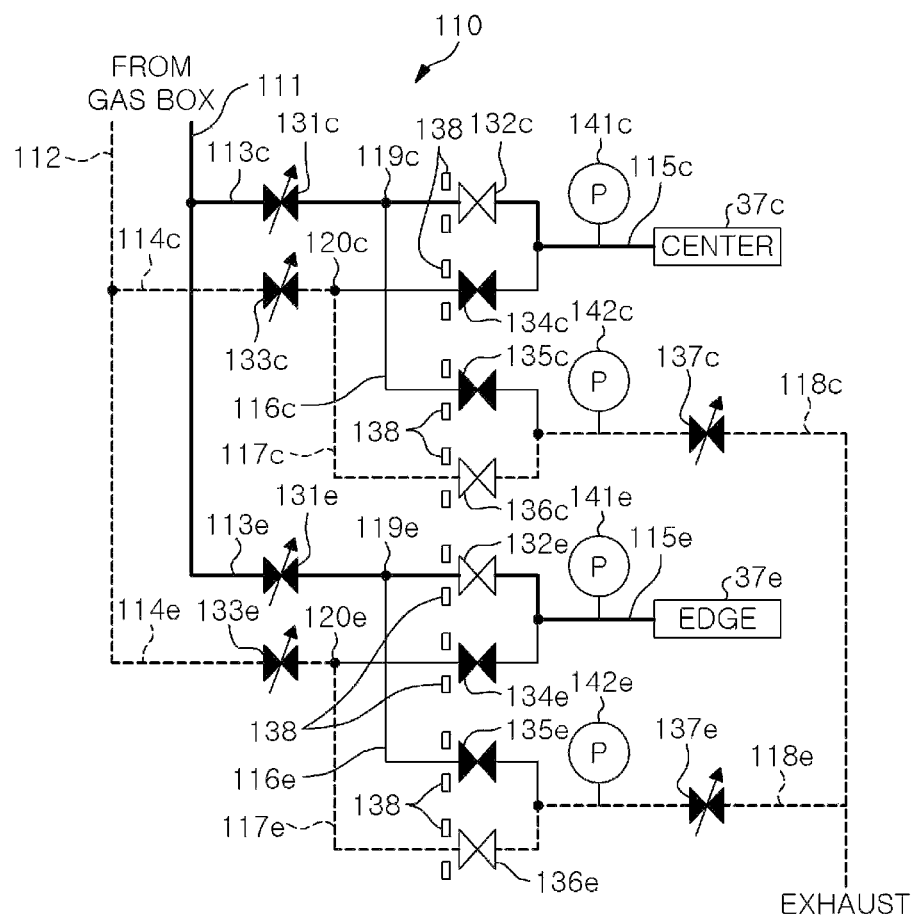
FIG. 12D shows an example of the control flow of the control method for the gas supply system according to the embodiment.

FIG. 12D shows the states of the valves of the gas supply system 110 in step S4. In step S4, the pressure of the second processing gas increases at the upstream side of each of the exhaust flow rate control valves 137c and 137e in the second processing gas supply paths.

Next, when the pressures of the pressure gauges 142c and 142e become equal to or higher than the pressures of the pressure gauges 141c and 141e, respectively, the process controller 101 controls the valves of the gas supply system 110 as follows (step S5):

Flow rate control valve 131c: Pressure ratio control
Flow rate control valve 133c: Pressure ratio control
Flow rate control valve 131e: Pressure ratio control
Flow rate control valve 133e: Pressure ratio control
Supply on/off valve 132c: Closed state
Exhaust on/off valve 135c: Open state
Supply on/off Valve 132e: Closed state
Exhaust on/off valve 135e: Open state
Supply on/off valve 134c: Open state
Exhaust on/off valve 136c: Closed state
Supply on/off valve 134e: Open state
Exhaust on/off valve 136e: Closed state
Exhaust flow rate control valve 137c: Initial opening degree
Exhaust Flow rate control valve 137e: initial opening degree.

Figure 12E:
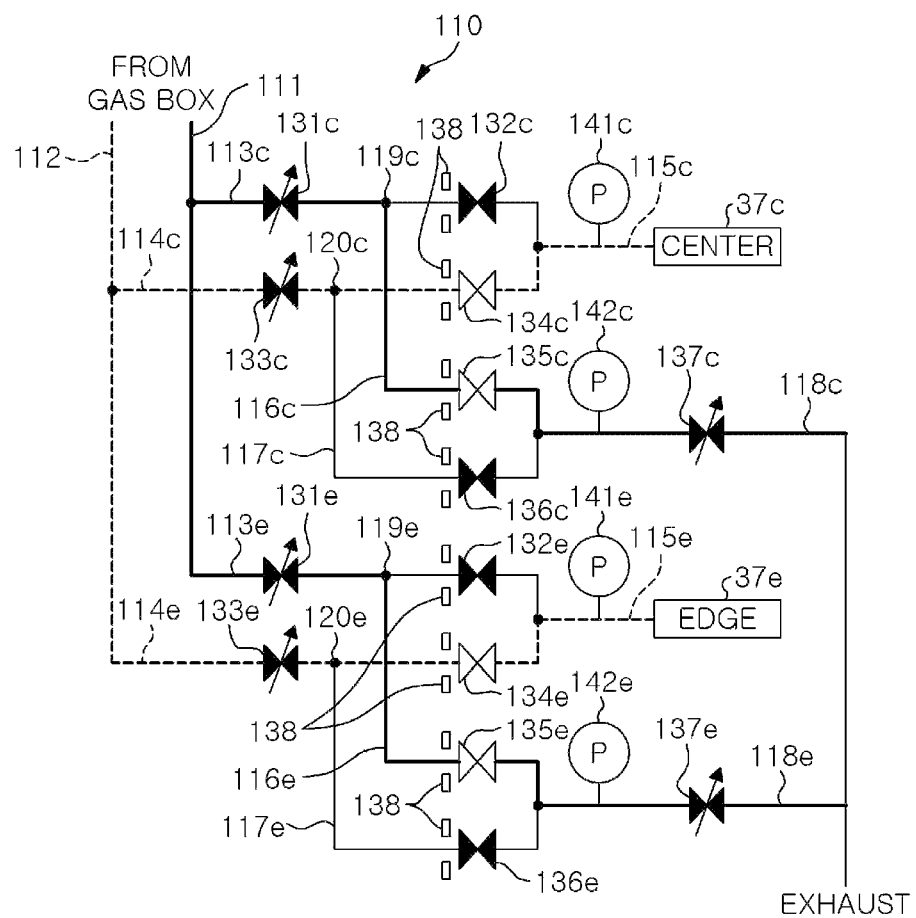
FIG. 12E shows an example of the control flow of the control method for the gas supply system according to the embodiment.

FIG. 12E shows the state of the valves of the gas supply system 110 in step S5. In step S5, the gas supplied to the gas diffusion zones 37c and 37e is switched from the first processing gas to the second processing gas. In the gas supply system 110, since pressure ratio control is performed while exhausting the second processing gas before the first processing gas is switched to the second processing gas, the second processing gas can be rapidly supplied at a predetermined ratio.

Next, when the gas supplied to the gas diffusion zones 37c and 37e is switched from the second processing gas to the first processing gas, the process controller 101 controls the valves of the gas supply system 110 as follows (Step S6):

Flow rate control valve 131c: Fixing opening degree when pressure ratio control is stable
Flow rate control valve 133c: Pressure ratio control
Flow rate control valve 131e: Fixing opening degree when pressure ratio control is stable
Flow rate control valve 133e: Pressure ratio control
Supply on/off valve 132c: Closed state
Exhaust on/off valve 135c: Open state
Supply on/off Valve 132e: Closed state
Exhaust on/off valve 135e: Open state
Supply on/off valve 134c: Open state
Exhaust on/off valve 136c: Closed state
Supply on/off valve 134e: Open state
Exhaust on/off valve 136e: Closed state
Exhaust flow rate control valve 137c: Initial opening degree
Exhaust Flow rate control valve 137e: initial opening degree.

Figure 12F:
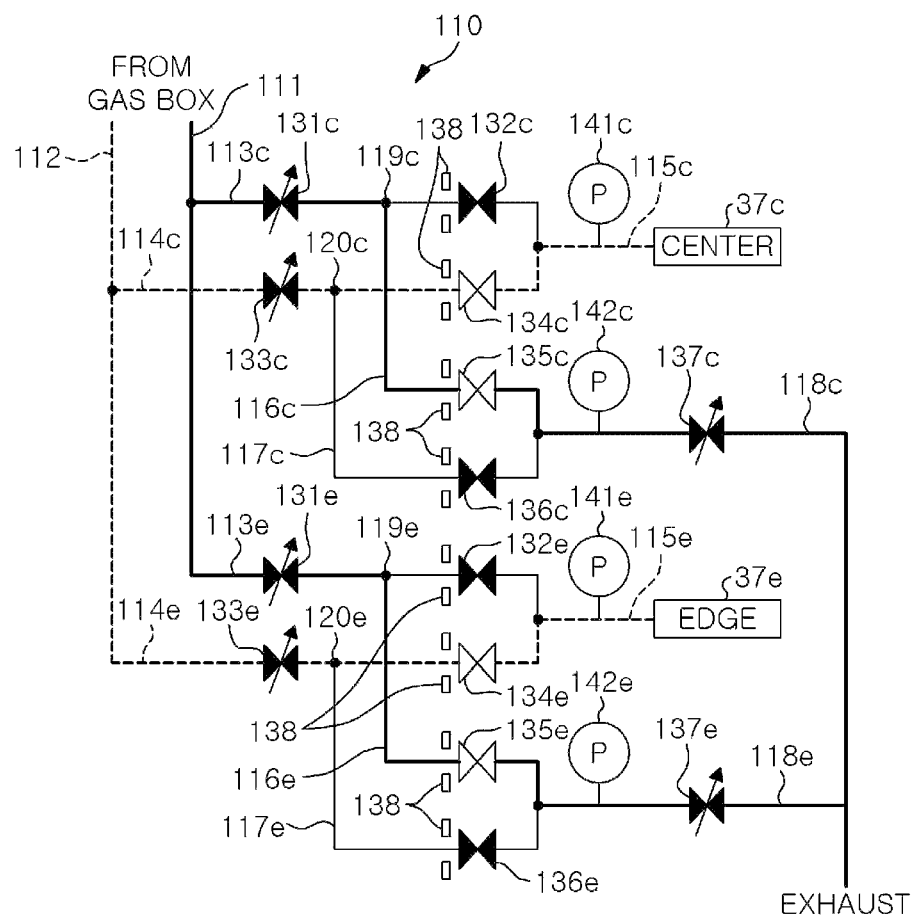
FIG. 12F shows an example of the control flow of the control method for the gas supply system according to the embodiment.

FIG. 12F shows the states of the valves of the gas supply system 110 in step S6. In step S6, the opening degrees of the flow rate control valves 133c and 133e are fixed while the first process gas is supplied at a predetermined ratio.

Next, the process controller 101 controls the valves of the gas supply system 110 as follows (step S7):

Flow rate control valve 131c: Fixing opening degree
Flow rate control valve 133c: Pressure ratio control
Flow rate control valve 131e: Fixing opening degree
Flow rate control valve 133e: Pressure ratio control
Supply on/off valve 132c: Closed state
Exhaust on/off valve 135c: Open state
Supply on/off Valve 132e: Closed state
Exhaust on/off valve 135e: Open state
Supply on/off valve 134c: Open state
Exhaust on/off valve 136c: Closed state
Supply on/off valve 134e: Open state
Exhaust on/off valve 136e: Closed state
Exhaust flow rate control valve 137c: Closed state or changing to smaller opening degree
Exhaust Flow rate control valve 137e: Closed state or changing to smaller opening degree.

Figure 12G:
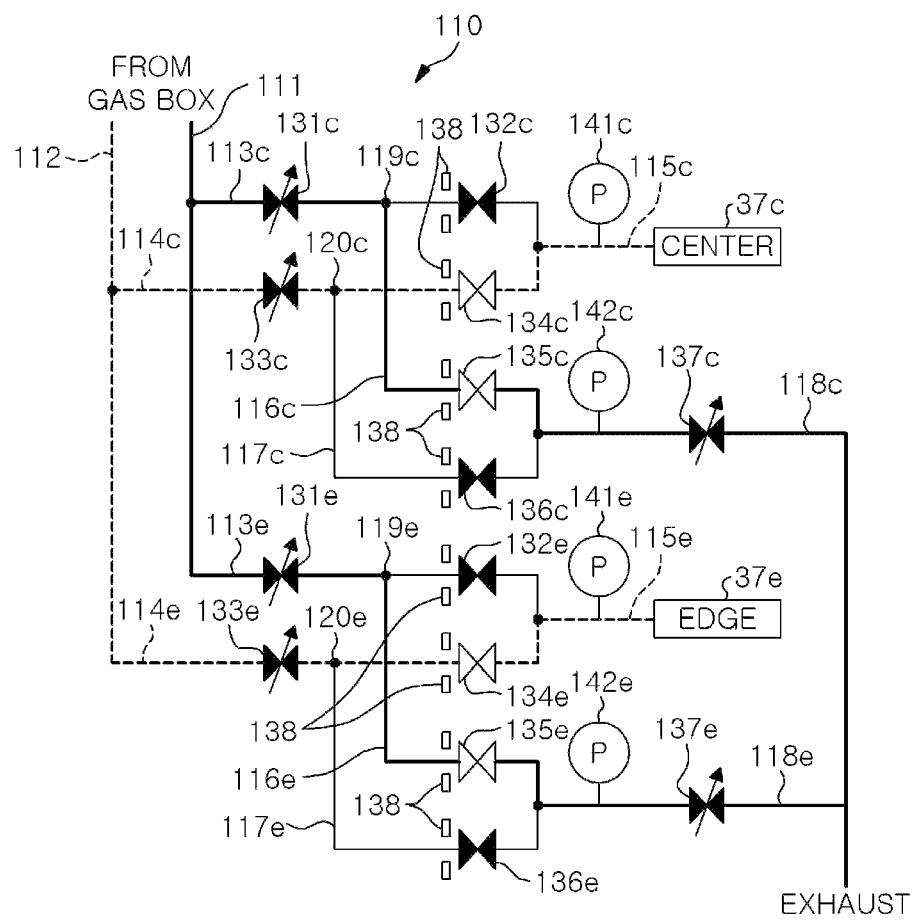
FIG. 12G shows an example of the control flow of the control method for the gas supply system according to the embodiment.

FIG. 12G shows the states of the valves of the gas supply system 110 in step S7. In step S7, the pressure of the first processing gas increases at the upstream sides of the exhaust flow rate control valves 137c and 137e in the supply paths of the first processing gas.

When the pressures of the pressure gauges 142c and 142e become equal to or higher than the pressures of the pressure gauges 141c and 141e, respectively, the process controller 101 returns to step S2 and controls the valves of the gas supply system 110 as described in step S2. Accordingly, the gas supplied to the gas diffusion zones 37c and 37e is switched from the second processing gas to the first processing gas. In the gas supply system 110 according to the present embodiment, since pressure ratio control is performed while exhausting the first processing gas before the second processing gas is switched to the first processing gas, the first processing gas can be rapidly supplied at a predetermined ratio.

As described above, the gas supply system 110 according to the present embodiment includes the upper electrode 30, the gas supply lines 113c and 113e, the gas supply lines 114c and 114e, the gas exhaust lines 116c and 116e, and the gas exhaust lines 117c and 117e. The gas supply system 110 further includes the supply on/off valves 132c and 132e, the supply on/off valves 134c and 134e, the exhaust on/off valves 135c and 135e, the exhaust on/off valves 136c and 136e, and the controller 100.

The upper electrode 30 is disposed to face the substrate support 16 on which the wafer W is to be placed. The upper electrode 30 injects the supplied gas from a plurality of injection holes formed on the facing surface facing the substrate support 16. The gas supply lines 113c and 113e are connected to the upper electrode 30 and supply the first processing gas. The gas supply lines 114c and 114e are connected to the upper electrode 30 and supply the second processing gas. The gas exhaust lines 116c and 116e are branched from the gas supply lines 113c and 113e, respectively, and exhaust the first processing gas flowing through the gas supply lines 113c and 113e to the gas exhaust mechanism. The gas exhaust lines 117c and 117e are branched from the gas supply lines 114c and 114e, respectively, and exhaust the second processing gas flowing through the gas supply lines 114c and 114e to the gas exhaust mechanism. The supply on/off valves 132c and 132e are disposed at the downstream sides of the branch points 119c and 119e where the gas exhaust lines 116c and 116e are branched from the gas supply lines 113c and 113e, respectively, and each of the supply on/off valves 132c and 132e is configured to switch the ON/OFF states of the gas supply lines 113c and 113e. The supply on/off valves 134c and 134e are disposed at the downstream sides of the branch points 120c and 120e where the gas exhaust lines 117c and 117e are branched from the gas supply lines 114c and 114e, and each of the supply on/off valves 134c and 134e is configured to switch the ON/OFF states of the gas supply lines 114c and 114e. Each of the exhaust on/off valves 135c and 135e is configured to switch the ON/OFF states of the gas exhaust lines 116c and 116e. Each of the exhaust on/off valves 136c and 136e is configured to switch the ON/OFF states of the gas exhaust lines 117c and 117e.

When the gas supplied to the upper electrode 30 is switched from the first processing gas to the second processing gas, the controller 100 controls the supply on/off valves 132c and 132e and the exhaust on/off valves 136c and 136e to be in the open state, and controls the supply on/off valves 134c and 134e and the exhaust on/off valves 135c and 135e to be in the closed state. Thereafter, the controller 100 controls the supply on/off valves 134c and 134e and the exhaust on/off valves 135c and 135e to be in the open state, and controls the supply on/off valves 132c and 132e and the exhaust on/off valves 136c and 136e to be in the closed state. Further, when the gas supplied to the upper electrode 30 is switched from the second processing gas to the first processing gas, the control unit 100 controls the supply on/off valves 134c and 134e and the exhaust on/off valves 135c and 135e to be in the open state, and controls the supply on/off valves 132c and 132e and the exhaust on/off valves 136c and 136e to be in the closed state.

Thereafter, the controller 100 controls the supply on/off valves 132c and 132e and the exhaust on/off valves 136c and 136e to be in the open state, and controls the supply on/off valves 134c and 134e and the exhaust on/off valves 135c and 135e to be in the closed state. Accordingly, in the gas supply system 110, the processing gas can be stably and rapidly supplied.

Further, in the gas supply system 110 according to the present embodiment, when the gas supplied to the upper electrode 30 is switched from the first processing gas to the second processing gas, the controller 100 switches the supply on/off valves 134c and 134e from the closed state to the open state after switching the supply on/off valves 132c and 132e from the open state to the closed state. When the gas supplied to the upper electrode 30 is switched from the second processing gas to the first processing gas, the control unit 100 switches the supply on/off valve 132c and 132e from the closed state to the open state after switching the supply on/off valves 134c and 134e from the open state to the closed state. Accordingly, in the gas supply system 110, it is possible to prevent the supply paths of the first processing gas and the supply paths of the second processing gas from being connected to each other when the gas supplied to the upper electrode 30 is switched.

Further, in the gas supply system 110 according to the present embodiment, the gas supply lines 113c and 113e are respectively connected to the upper electrode 30 at the downstream sides of the supply on/off valves 132c and 132e and the gas supply lines 114c and 114e are respectively connected to the upper electrode 30 at the downstream sides of the supply on/off valves 134c and 134e through the common lines 115c and 115e respectively having the pressure gauges 141c and 141e. The gas exhaust lines 116c and 116e are respectively connected to the gas exhaust mechanism at the downstream sides of the exhaust on/off valves 135c and 135e and the gas supply lines 117c and 117e are respectively connected to the gas exhaust mechanism at the downstream sides of the exhaust on/off valves 136c and 136e through the common lines 118c and 118e respectively having the pressure gauges 142c and 142e. The common lines 118c and 118e are respectively provided with the exhaust flow rate control valves 137c and 137e, which are configured to adjust the opening degrees thereof, at the downstream sides of the pressure gauges 142c and 142e. The gas supply lines 113c and 113e are respectively provided with first supply flow rate control valves, which are configured to adjust the opening degrees thereof, at the upstream sides of the branch points where the gas exhaust lines 116c and 116e are branched. The gas supply lines 114c and 114e are respectively provided with second supply flow rate control valves, which are configured to adjust the opening degrees thereof, at the upstream sides of the branch points where the gas exhaust lines 117c and 117e are branched.

When the gas supplied to the upper electrode 30 is switched from the first processing gas to the second processing gas, the controller 100 controls the opening degrees of the exhaust flow rate control valves 137c and 137e to correspond to the conductance when the gas is injected from the upper electrode 30. The controller 100 respectively controls the opening degrees of the second supply flow rate control valves so that the pressures of the pressure gauges 142c and 142e become the pressures corresponding to the flow rates of the second processing gas.

Thereafter, the controller 100 respectively controls the opening degrees of the exhaust flow rate control valves 137c and 137e so that the exhaust flow rate control valves 137c and 137e are in the closed state or the opening degrees thereof is adjusted to small degrees. When the pressures of the pressure gauges 142c and 142e become equal to or higher than the pressures of the pressure gauges 141c and 141e, respectively, the controller 100 switches the supply on/off valves 132c and 132e from the open state to the closed state and switches the supply on/off valves 134c and 134e from the closed state to the open state.

In addition, when the gas supplied to the upper electrode 30 is switched from the second processing gas to the first processing gas, the controller 100 controls the exhaust flow rate control valves 137c and 137e to correspond to the conductance when the gas is injected from the upper electrode 30. The controller 100 respectively controls the opening degrees of the first supply flow rate control valves so that the pressures of the pressure gauges 142c and 142e become the pressures corresponding to the flow rate of the first processing gas.

Thereafter, the controller 100 respectively controls the opening degrees of the exhaust flow rate control valves 137c and 137e so that the exhaust flow rate control valves 137c and 137e are in the closed or the opening degrees thereof is adjusted to a small degree. When the pressures of the pressure gauges 142c and 142e become equal to or higher than the pressures of the pressure gauges 141c and 141e, respectively, the controller 100 switches the supply on/off valves 134c and 134e from the open state to the closed state and switches the supply on/off valves 132c and 132e from the closed state to the open state. Accordingly, in the gas supply system 110, when the switching between the first processing gas and the second processing gas is performed, it is possible to suppress the occurrence of the backflow of the switched-out processing gas.

Further, in the gas supply system 110 according to the present embodiment, the inner space of the upper electrode 30 is divided into the gas diffusion zones 37c and 37e, and the gas diffusion zones 37c and 37e are connected to the gas injection holes so that the gas supplied to the gas diffusion zones 37c and 37e is injected from the gas injection holes connected to the corresponding gas diffusion zones 37c and 37e. The gas supply system 110 includes, for the gas diffusion zones of the upper electrode 30, the gas supply lines 113c and 113e, the gas supply lines 114c and 114e, the gas exhaust lines 116c and 116e, the gas exhaust lines 117c and 117e, the supply on/off valves 132c and 132e, the supply on/off valves 134c and 134e, the exhaust on/off valves 135c and 135e, and the exhaust on/off valves 136c and 136e, respectively. Accordingly, in the gas supply system 110 according to the present embodiment, it is possible to stably and rapidly switch and inject the processing gas from the gas injection holes communicating with the gas diffusion zones 37c and 37e.

Further, in the gas supply system 110 according to the present embodiment, the controller 100 obtains the pressures of the processing gas respectively corresponding to the flow rates of the processing gas supplied to the gas diffusion zones 37c and 37e of the upper electrode 30 based on the characteristic data indicating the relationship between the flow rate and the pressure of the processing gas. The controller 100 controls so that the processing gas is split to the gas diffusion zones of the upper electrode 30 at the obtained pressure ratio of the processing gas.

Accordingly, in the gas supply system 110 according to the present embodiment, it is possible to split the processing gas into the gas diffusion zones 37c and 37 at a stable ratio even when the total flow rate of the processing gas changes.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

For example, in the above-described embodiments, the case where the gas supply system 110 is used for the atomic layer etching in which the first processing gas and the second processing gas are alternately supplied has been described as an example. However, the present disclosure is not limited thereto. The gas supply system 110 may be used for any treatment as long as the treatment is performed by alternately supplying the first processing gas and the second processing gas. For example, the gas supply system 110 may be used for atomic layer deposition (ALD) in which a film is formed by alternately supplying the first processing gas and the second processing gas.

Further, in the above-described embodiments, the case where the plasma processing apparatus 10 is a plasma etching apparatus has been described as an example. However, the present disclosure is not limited thereto. The plasma processing apparatus 10 may be a film forming apparatus that performs a film formation using plasma or a modification apparatus that performs modification of film quality and the like.

Further, in the above-described embodiments, the case where the plasma etching is performed as the plasma treatment has been described as an example. However, the present disclosure is not limited thereto. The plasma treatment may be any treatment using plasma.

Further, in the above-described embodiments, the case where the target object is the wafer W has been described as an example. However, the present disclosure is not limited thereto. The target object may be any substrate such as a glass substrate.

DESCRIPTION OF REFERENCE NUMERALS

10: plasma processing apparatus
16: substrate support
30: upper electrode
100: controller
101: process controller
102: user interface
103: storage unit
110: gas supply system
113c, 113e: gas supply line
114c, 114e: gas supply line
115c, 115e: common line
116c, 116e: gas exhaust line
118c, 118e: common line
117c, 117e: gas exhaust line
132c, 132e: supply on/off valve
134c, 134e: supply on/off valve
135c, 135e: Exhaust on/off valve
136c, 136e: Exhaust on/off valve
137c, 137e: Exhaust flow rate control valve
141c, 141e: pressure gauge
142c, 142e: pressure gauge
W: wafer

The invention claimed is:

1. A plasma processing apparatus comprising:
a gas supply system;
a chamber having a shower head, at least one gas injection hole connected to the gas supply system, and at least one gas exhaust port connected to an exhaust mechanism;
a substrate support disposed in the chamber and configured to support a substrate having an etching target film;
a power supply for plasma generation; and
a controller,
wherein the gas supply system includes:
a first gas supply line that is connected to the at least one gas injection port and a first gas source and configured to supply a first processing gas into the chamber;
a second gas supply line that is connected to the at least one gas injection port and a second gas source and configured to supply a second processing gas into the chamber;
a first gas exhaust line that is branched from the first gas supply line and configured to exhaust the first processing gas flowing through the first gas supply line to an outside of the chamber;
a second gas exhaust line that is branched from the second gas supply line and configured to exhaust the second processing gas flowing through the second gas supply line to the outside of the chamber;
a first supply on/off valve that is disposed at a downstream side of a branch point of the first gas supply line where the first gas exhaust line is branched and configured to switch an ON/OFF state of the first gas supply line;
a second supply on/off valve that is disposed at a downstream side of a branch point of the second gas supply line where the second gas exhaust line is branched and configured to switch an ON/OFF state of the second gas supply line;
a first exhaust on/off valve configured to switch an ON/OFF state of the first gas exhaust line; and
a second exhaust on/off valve configured to switch an ON/OFF state of the second gas exhaust line,
wherein the controller is configured to perform:
(a) disposing the substrate on the substrate support;
(b) controlling the first supply on/off valve and the second exhaust on/off valve to be in an open state and the second supply on/off valve and the first exhaust on/off valve to be in a closed state and supplying the first processing gas into the chamber to adsorb an adsorbate generated based on the first processing gas on the substrate;

(c) controlling the second supply on/off valve and the first exhaust on/off valve to be in the open state and the first supply on/off valve and the second exhaust on/off valve to be in the closed state and supplying the second processing gas into the chamber to activate the adsorbate;

(d) repeating (b) and (c);

when switching from (b) to (c), controlling the first supply on/off valve and the second exhaust on/off valve to be in a closed state and the second supply on/off valve and the first exhaust on/off valve to be in an open state; and when switching from (c) to (b), controlling the second supply on/off valve and the first exhaust on/off valve to be in the closed state and the first supply on/off valve and the second exhaust on/off valve to be in the open state.

2. The plasma processing apparatus of claim 1, wherein the controller is configured to perform:
exhausting the second processing gas to the outside of the chamber during (b); and
exhausting the first processing gas to the outside of the chamber during (c).

3. The plasma processing apparatus of claim 1, wherein, when switching from (b) to (c), the controller controls the second supply on/off valve and the first exhaust on/off valve to be in an open state after the first supply on/off valve and the second exhaust on/off valve to be in a closed state.

4. The plasma processing apparatus of claim 1, wherein, when switching from (c) to (b), the controller controls the first supply on/off valve and the second exhaust on/off valve to be in the open state after the second supply on/off valve and the first exhaust on/off valve to be in the closed state.

5. The plasma processing apparatus of claim 1, wherein, when switching from (b) to (c) or switching from (c) to (b), the controller controls the gas supply system such that an initial pressure of a switched-in processing gas is equal to or higher than a pressure of a switched-out processing gas that remains in the shower head.

6. The plasma processing apparatus of claim 1, wherein the first gas supply line and the second gas supply line are connected to the at least one gas injection hole through a common line.

7. The plasma processing apparatus of claim 6, wherein the common line has a pressure gauge for measuring a pressure of a gas supplied to the shower head.

8. The plasma processing apparatus of claim 1, wherein the controller is configured to perform etching of the substrate during (c).

9. The plasma processing apparatus of claim 1, wherein the controller is configured to form a film on the substrate during (c).

10. The plasma processing apparatus of claim 1, wherein the first gas supply line is connected to the at least one gas injection hole at a downstream side of the first supply on/off valve and the second gas supply line is connected to the at least one gas injection hole at a downstream side of the second supply on/off valve through a first common line having a first pressure gauge, the first gas exhaust line is connected to the outside of the chamber at a downstream side of the first exhaust on/off valve and the second gas exhaust line is connected to the outside of the chamber at a downstream side of the second exhaust on/off valve through a second common line having a second pressure gauge, the second common line is provided with an exhaust flow rate control valve, which is configured to adjust an opening degree thereof, at a downstream side of the second pressure gauge, the first gas supply line is provided with a first supply flow rate control valve, which is configured to adjust an opening degree thereof, at an upstream side of the branch point where the first gas exhaust line is branched, and the second gas supply line is provided with a second supply flow rate control valve, which is configured to adjust an opening degree thereof, at an upstream side of the branch point where the second gas exhaust line is branched, wherein when switching from (b) to (c), the controller controls the opening degree of the exhaust flow rate control valve to correspond to a conductance when a gas is injected from the at least one gas injection hole, and the opening degree of the second supply flow rate control valve so that a pressure of the second pressure gauge becomes a pressure corresponding to a flow rate of the second processing gas and, thereafter, the controller controls the opening degree of the exhaust flow rate control valve to close the exhaust flow rate control valve or adjust the opening degree of the exhaust flow rate control valve to a small degree and, then, when the pressure of the second pressure gauge becomes equal to or higher than a pressure of the first pressure gauge, the controller switches the first supply on/off valve from the open state to the closed state and switches the second supply on/off valve from the closed state to the open state, and wherein when switching from (c) to (b), the controller controls the opening degree of the exhaust flow rate control valve to correspond to a conductance when the gas is injected from the at least one gas injection hole, and the opening degree of the first supply flow rate control valve so that a pressure of the second pressure gauge becomes a pressure corresponding to a flow rate of the first processing gas and, thereafter, the controller controls the opening degree of the exhaust flow rate control valve to close the exhaust flow rate control valve or adjust the opening degree of the exhaust flow rate control valve to a small degree and, then, when the pressure of the second pressure gauge becomes equal to or higher than a pressure of the first pressure gauge, the controller switches the second supply on/off valve from the open state to the closed state and switches the first supply on/off valve from the closed state to the open state.

11. The plasma processing apparatus of claim 1, wherein an inner space of the shower head is divided into a plurality of spaces, the respective spaces communicate with the at least one gas injection hole so that the gas supplied to each of the spaces is injected from at least one gas injection hole communicating with the corresponding space, and the first gas supply line, the second gas supply line, the first gas exhaust line, the second gas exhaust line, the first supply on/off valve, the second supply on/off valve, the first exhaust on/off valve, and the second exhaust on/off valve are provided for each of the spaces of the shower head.

12. The plasma processing apparatus of claim 11, wherein the controller obtains pressures of the first processing gas or the second processing gas respectively corresponding to flow rates of the processing gas supplied to the spaces of the shower head based on characteristic data indicating a relationship between the flow rate and the pressure of the processing gas, and the controller controls so that the processing gas is split to the spaces of the shower head at the obtained pressure ratio of the processing gas.

13. A control method for a plasma processing apparatus, wherein the plasma processing apparatus includes: a gas supply system; a chamber having a shower head, at least one gas injection hole connected to the gas supply system, and at least one gas exhaust port connected to an exhaust mechanism; a substrate support disposed in the chamber and configured to support a substrate having an etching target film; a power supply for plasma generation; and a controller, wherein the gas supply system includes: a first gas supply line that is connected to the at least one gas injection hole and a first gas source and configured to supply a first processing gas into the chamber; a second gas supply line that is connected to the at least one gas injection hole and a second gas source and configured to supply a second processing gas into the chamber; a first gas exhaust line that is branched from the first gas supply line and configured to exhaust the first processing gas flowing through the first gas supply line to an outside of the chamber; a second gas exhaust line that is branched from the second gas supply line and configured to exhaust the second processing gas flowing through the second gas supply line to the outside of the chamber; a first supply on/off valve that is disposed at a downstream side of a branch point of the first gas supply line where the first gas exhaust line is branched and configured to switch an ON/OFF state of the first gas supply line; a second supply on/off valve that is disposed at a downstream side of a branch point of the second gas supply line where the second gas exhaust line is branched and configured to switch an ON/OFF state of the second gas supply line; a first exhaust on/off valve configured to switch an ON/OFF state of the first gas exhaust line; and a second exhaust on/off valve configured to switch an ON/OFF state of the second gas exhaust line, the control method comprising:
(a) disposing the substrate on the substrate support;
(b) controlling the first supply on/off valve and the second exhaust on/off valve to be in an open state and the second supply on/off valve and the first exhaust on/off valve to be in a closed state and supplying the first processing gas into the chamber to adsorb an adsorbate generated based on the first processing gas on the substrate;
(c) controlling the second supply on/off valve and the first exhaust on/off valve to be in the open state and the first supply on/off valve and the second exhaust on/off valve to be in the closed state and supplying the second processing gas into the chamber to activate the adsorbate;
(d) repeating (b) and (c);
when switching from (b) to (c), controlling the first supply on/off valve and the second exhaust on/off valve to be in a closed state and the second supply on/off valve and the first exhaust on/off valve to be in an open state; and
when switching from (c) to (b), controlling the second supply on/off valve and the first exhaust on/off valve to be in the closed state and the first supply on/off valve and the second exhaust on/off valve to be in the open state.

* * * * *